(12) United States Patent
Kawashima et al.

(10) Patent No.: US 12,224,331 B2
(45) Date of Patent: Feb. 11, 2025

(54) SEMICONDUCTOR DEVICE

(71) Applicant: Nuvoton Technology Corporation Japan, Kyoto (JP)

(72) Inventors: Katsuhiko Kawashima, Hyogo (JP); Yoshinori Takami, Toyama (JP); Dai Motojima, Toyama (JP); Yusuke Kanda, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/895,947

(22) Filed: Sep. 25, 2024

(65) Prior Publication Data

US 2025/0022933 A1  Jan. 16, 2025

Related U.S. Application Data

(63) Continuation of application No. PCT/JP2023/006838, filed on Feb. 24, 2023.
(Continued)

(51) Int. Cl.
*H01L 29/778* (2006.01)
*H01L 29/20* (2006.01)
(Continued)

(52) U.S. Cl.
CPC ........ *H01L 29/475* (2013.01); *H01L 29/2003* (2013.01); *H01L 29/402* (2013.01);
(Continued)

(58) Field of Classification Search
None
See application file for complete search history.

(56) References Cited

U.S. PATENT DOCUMENTS

| 8,390,000 B2 | 3/2013 | Chu et al. |
| 2007/0164321 A1 | 7/2007 | Sheppard et al. |

(Continued)

FOREIGN PATENT DOCUMENTS

| JP | 09-306926 A | 11/1997 |
| JP | 2004-288952 A | 10/2004 |

(Continued)

OTHER PUBLICATIONS

International Search Report dated Apr. 18, 2023 issued in International Patent Application No. PCT/JP2023/006838, with English translation.

(Continued)

*Primary Examiner* — Grant S Withers
(74) *Attorney, Agent, or Firm* — Rimon P.C.

(57) ABSTRACT

A semiconductor device includes: a gate electrode including a junction portion forming a Schottky junction with a barrier layer; a projecting portion including first and second gate field plates and projecting from the junction portion; and an insulating layer including first and second sidewalls. An angle formed between a highest position of a bottom surface of the first gate field plate and a main surface of a substrate, viewed from the first position, is a second elevation angle. An angle formed between an end on the drain electrode side of a lowest portion of a bottom surface of the second gate field plate and the main surface, viewed from the first position, is a third elevation angle. The second elevation angle is larger than the third elevation angle. The bottom surface of the second gate field plate includes an inclined surface where a distance from the barrier layer monotonically increases.

20 Claims, 29 Drawing Sheets

Related U.S. Application Data

(60) Provisional application No. 63/324,976, filed on Mar. 29, 2022.

(51) Int. Cl.
*H01L 29/40* (2006.01)
*H01L 29/423* (2006.01)
*H01L 29/47* (2006.01)
*H01L 29/66* (2006.01)

(52) U.S. Cl.
CPC ...... *H01L 29/404* (2013.01); *H01L 29/42316* (2013.01); *H01L 29/66462* (2013.01); *H01L 29/7786* (2013.01); *H01L 29/7787* (2013.01)

(56) References Cited

U.S. PATENT DOCUMENTS

| | | | |
|---|---|---|---|
| 2012/0119260 A1 | 5/2012 | Radulescu et al. | |
| 2014/0231823 A1 | 8/2014 | Chowdhury et al. | |
| 2015/0279722 A1* | 10/2015 | Kikuchi | H01L 29/402 |
| | | | 257/192 |
| 2017/0263724 A1* | 9/2017 | Kodera | H01L 29/402 |
| 2021/0257475 A1 | 8/2021 | Wong | |
| 2023/0124686 A1* | 4/2023 | Renaud | H01L 29/404 |
| | | | 257/76 |

FOREIGN PATENT DOCUMENTS

| | | |
|---|---|---|
| JP | 2009-524242 A | 7/2007 |
| JP | 2011-077123 A | 4/2011 |
| JP | 2013-191759 A | 9/2013 |
| JP | 2015-220430 A | 12/2015 |
| JP | 2016-511544 A | 4/2016 |
| JP | 2018-110138 A | 7/2018 |
| WO | 2007/084465 A1 | 7/2007 |
| WO | 2014/127150 A1 | 8/2014 |

OTHER PUBLICATIONS

International Preliminary Report on Patentability Chapter II (IPRP2) issued on Feb. 6, 2024 in International (PCT) Application No. PCT/JP2023/006838 with its English translation.

* cited by examiner

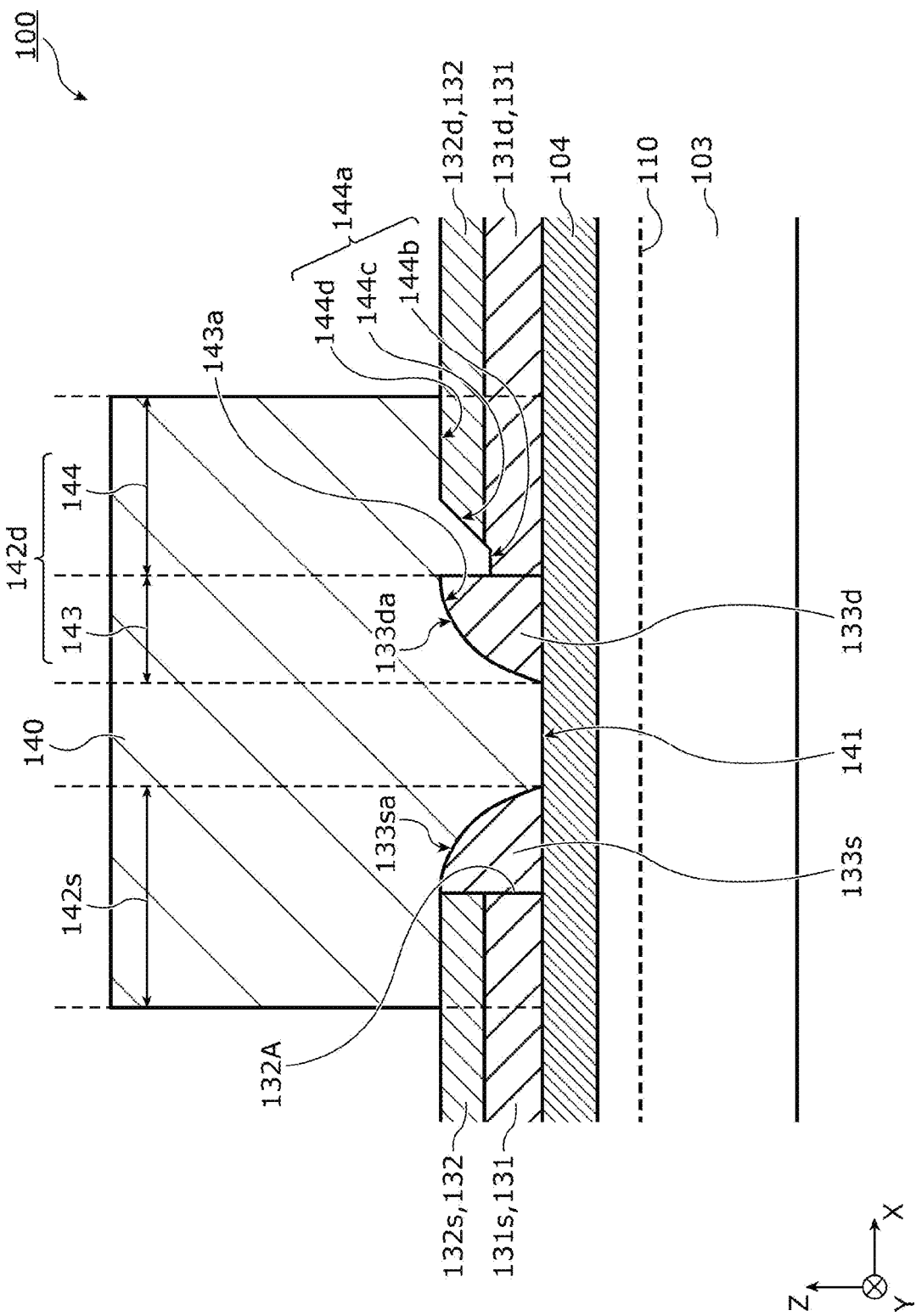

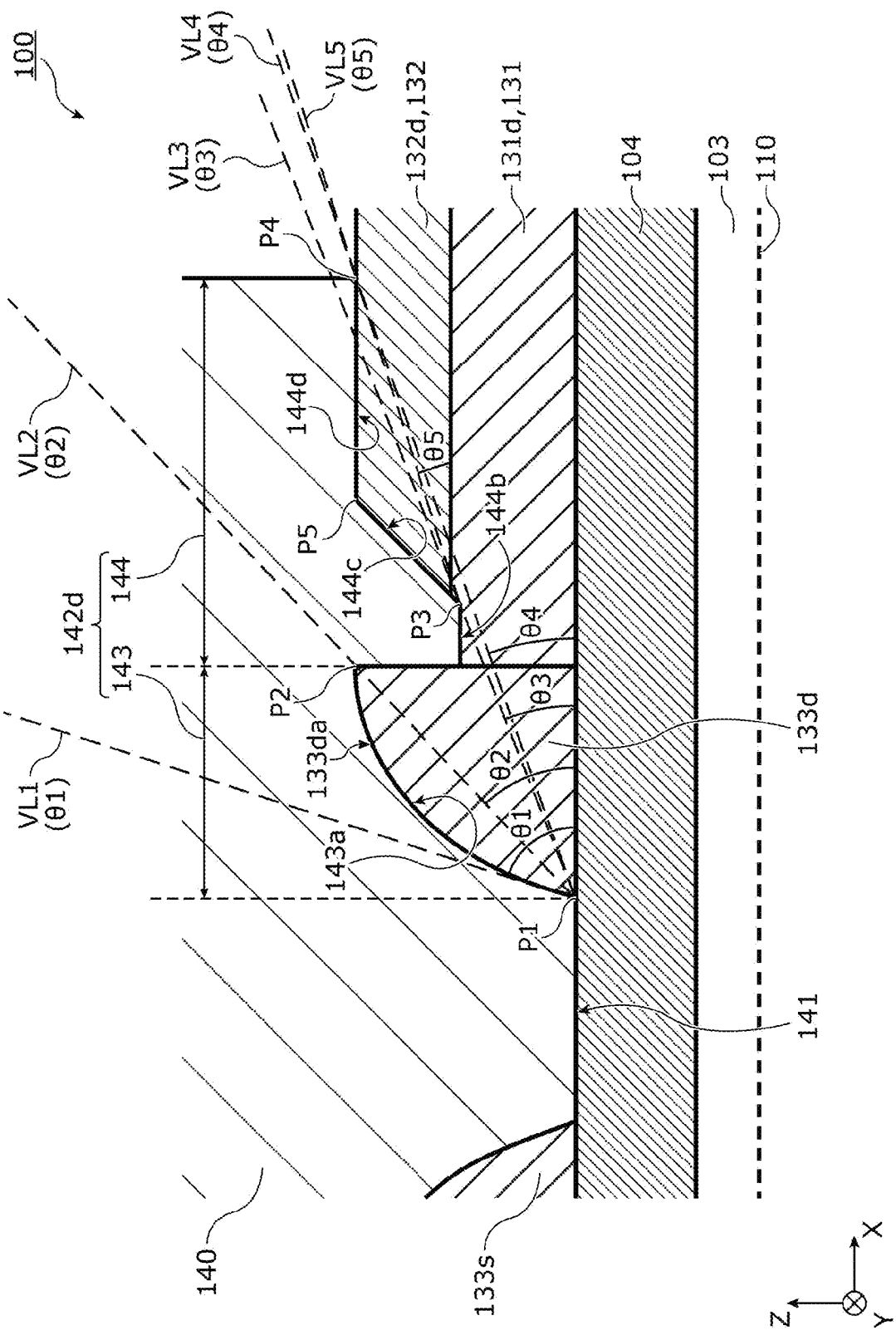

FIG. 4A
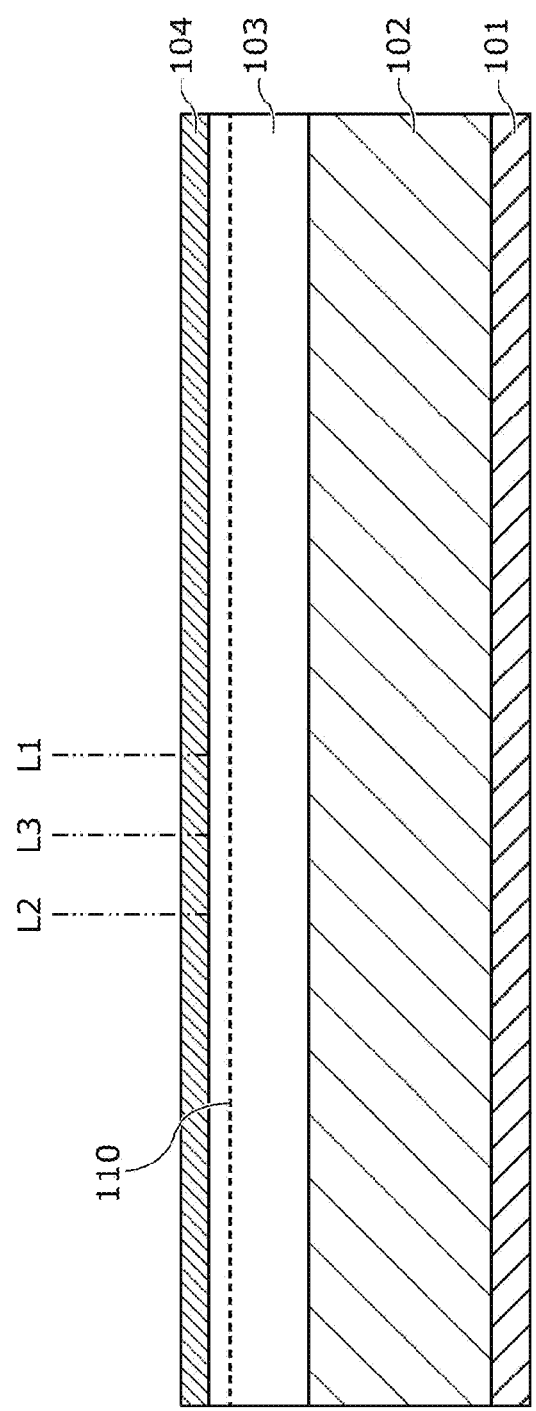
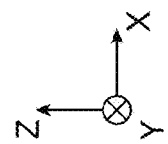

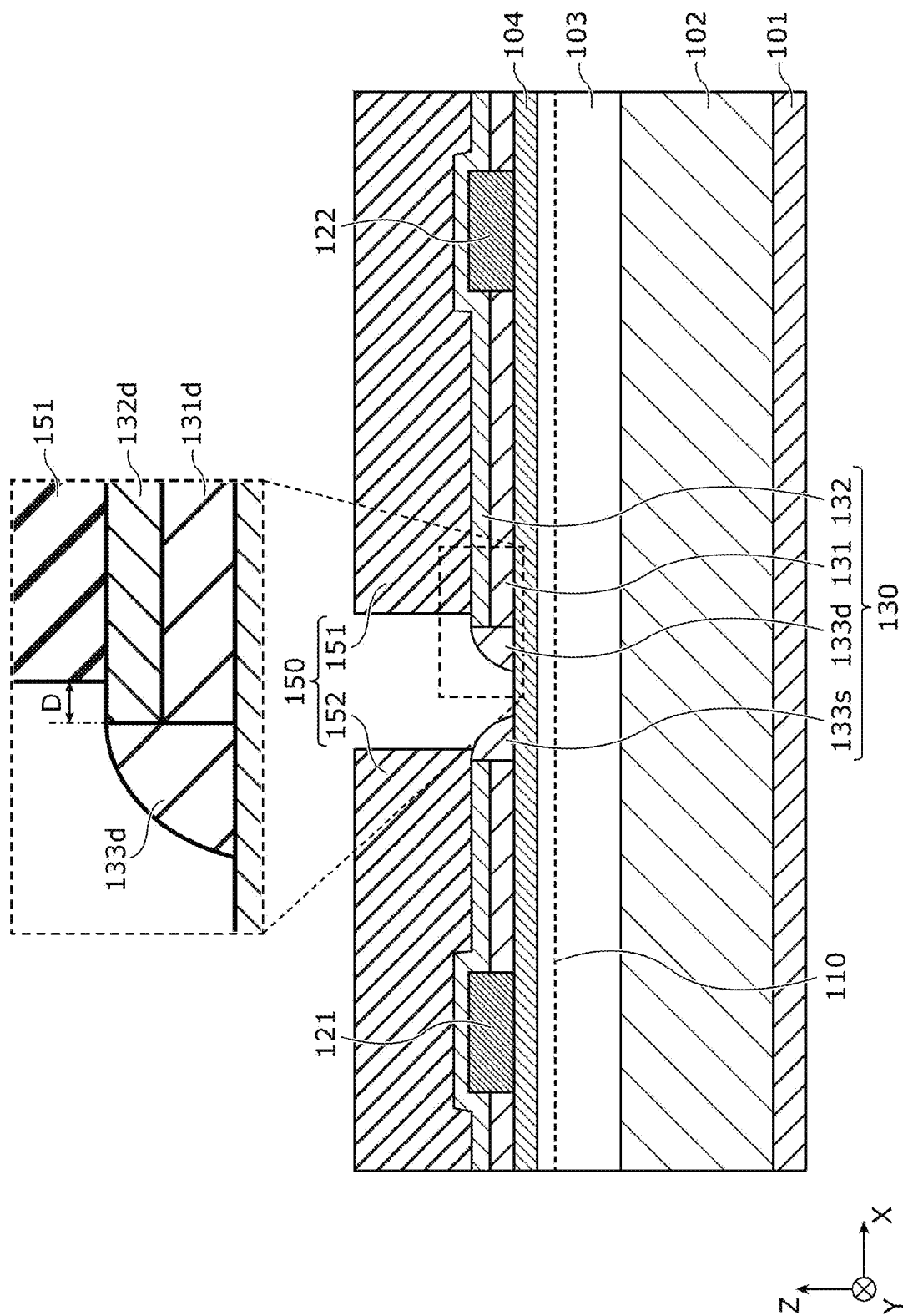

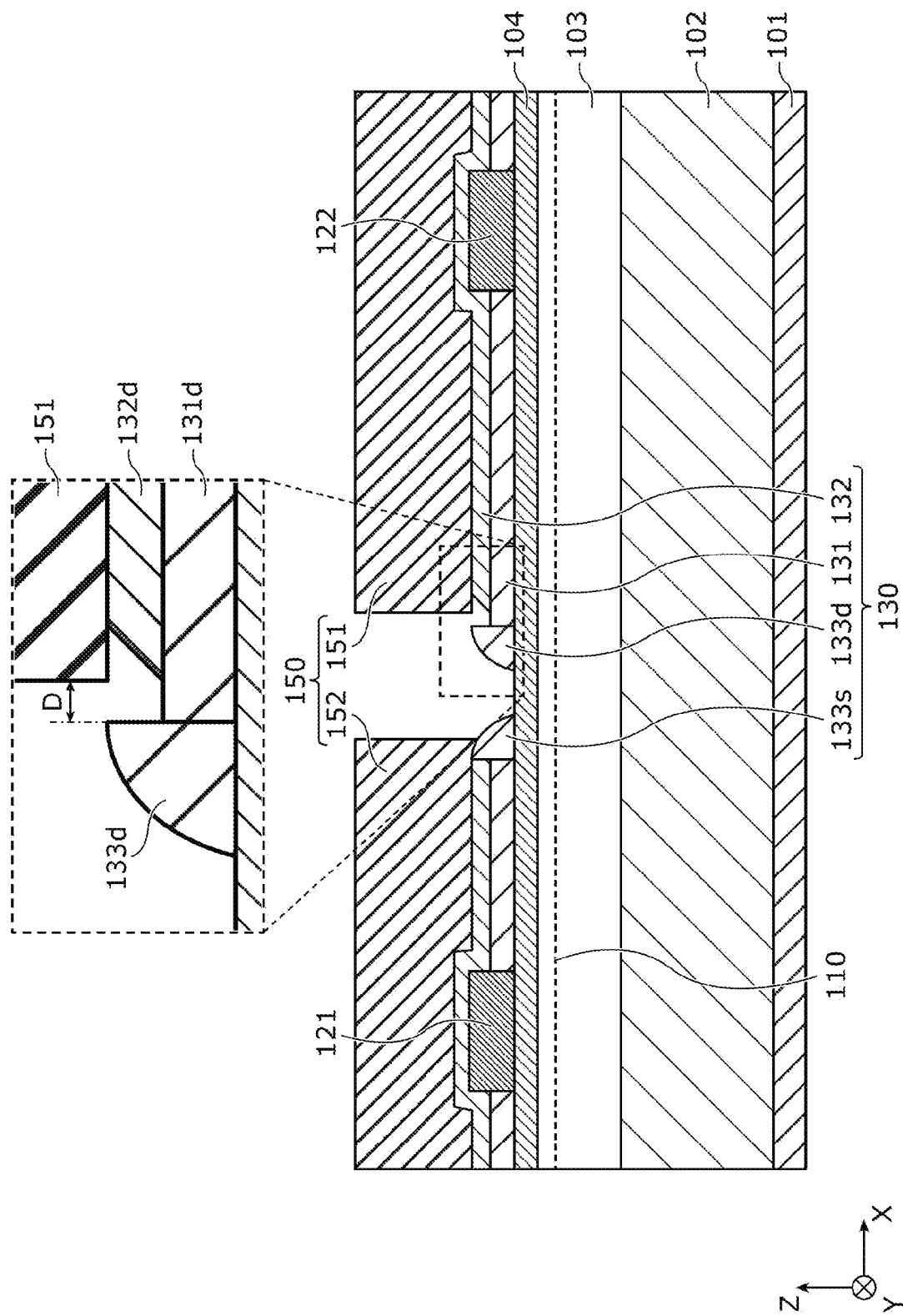

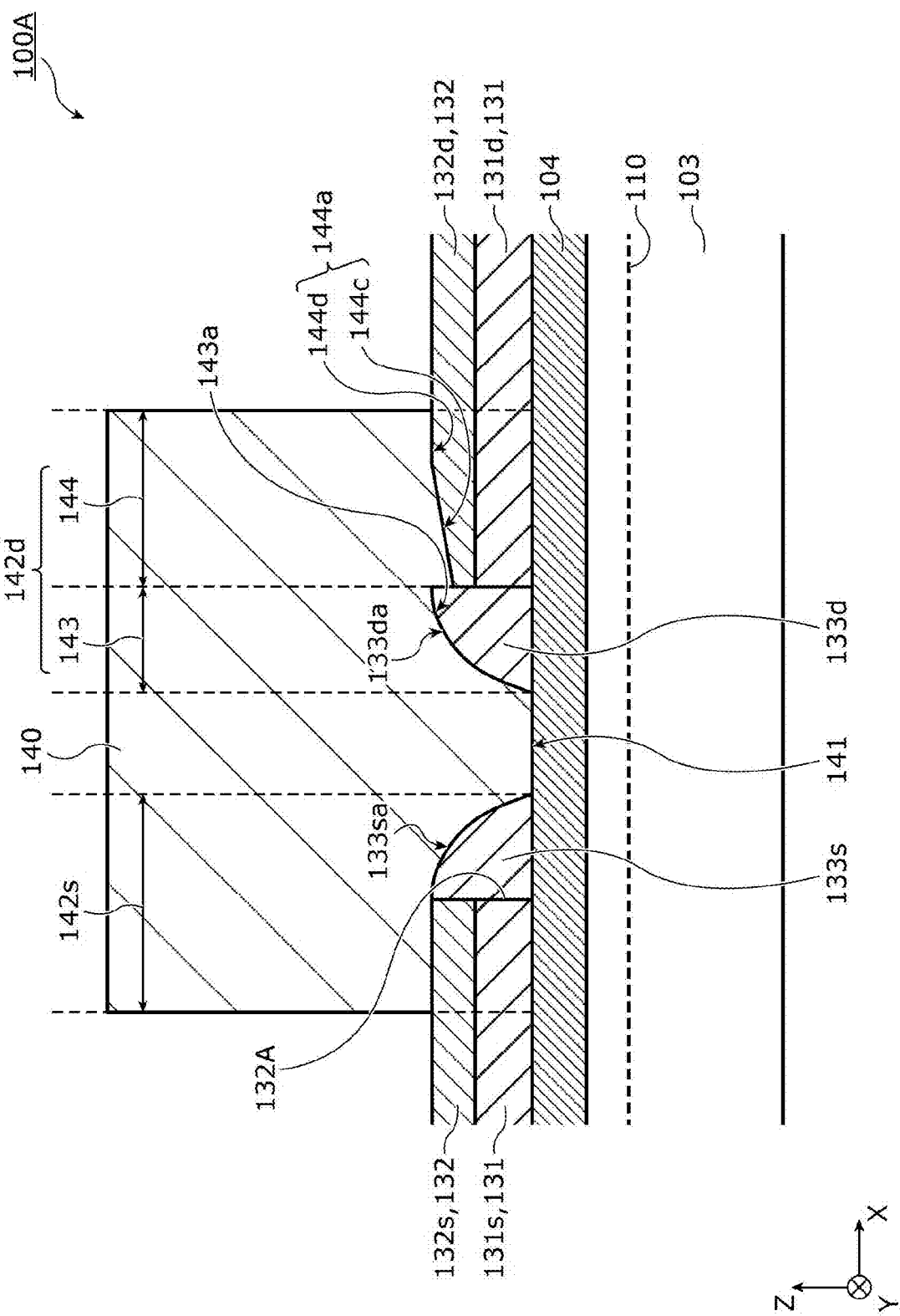

SEMICONDUCTOR DEVICE

CROSS REFERENCE TO RELATED APPLICATIONS

This is a continuation application of PCT International Application No. PCT/JP2023/006838 filed on Feb. 24, 2023, designating the United States of America, which is based on and claims priority of U.S. Provisional Patent Application No. 63/324,976 filed on Mar. 29, 2022. The entire disclosures of the above-identified applications, including the specifications, drawings and claims are incorporated herein by reference in their entirety.

FIELD

The present disclosure relates to semiconductor devices, and in particular to a group III nitride semiconductor device in which a group III nitride semiconductor is used.

BACKGROUND

Group III nitride semiconductor devices using group III nitride semiconductor, in particular, gallium nitride (GaN) or aluminum gallium nitride (AlGaN) have high dielectric breakdown voltages due to the wide bandgap of the materials. In addition, with the group III nitride semiconductor devices, a hetero structure such as AlGaN/GaN can be easily formed.

With the AlGaN/GaN hetero structure, due to the piezoelectric polarization generated by the difference in lattice constants between the materials and the spontaneous polarization of AlGaN and GaN, a channel including high-concentration electrons (hereinafter referred to as "two-dimensional electron gas") is formed on the GaN layer side of the AlGaN/GaN interface. The group III nitride semiconductor devices including the channels of the above-described two-dimensional electron gas have a relatively high electron saturation velocity, relatively high insulation resistance, and relatively high thermal conductivity, and thus are applied to high-frequency power devices.

In order to enhance the characteristics of the above-described group III nitride semiconductor devices, it is effective to miniaturize the gate dimensions (hereinafter denoted by Lg). In miniaturization of Lg, it is important to achieve both electric field relaxation using a field plate and reduction of parasitic capacitance.

FIG. 19 is a cross-sectional view illustrating a configuration of gate electrode 140x according to a conventional technique. More specifically, FIG. 19 illustrates the configuration in proximity to gate electrode 140x in semiconductor device 100x consisting of a group III nitride as described in Patent Literature (PTL) 1.

In semiconductor device 100x described in PTL 1, as illustrated in FIG. 19, GaN layer 103x and AlGaN layer 104x are disposed in sequence, and two-dimensional electron gas 110x is generated on the GaN layer 103x side due to the hetero structure. Insulating layer 130x is disposed above AlGaN layer 104x. Insulating layer 130x is provided with opening portion 130Ax in such a manner that AlGaN layer 104x is exposed. In opening portion 130Ax, first sidewall 133dx on a drain electrode side and second sidewall 133sx on a source electrode side are provided in contact with the side faces of insulating layer 130x. Although not illustrated in FIG. 19, a drain electrode is disposed on the positive side of an X-axis relative to gate electrode 140x, and a source electrode is disposed on the negative side of the X-axis relative to gate electrode 140x. The drain electrode and the source electrode are each in ohmic contact with two-dimensional electron gas 110x. Gate electrode 140x is provided so as to cover the top of insulating layer 130x and opening portion 130Ax to form a so-called T-shape in cross-section (T-type gate structure). PTL 1 describes that the T-type gate structure allows a reduction of Lg from approximately 0.1 μm to approximately 0.3 μm.

CITATION LIST

Patent Literature

PTL 1: US Patent Application Publication No. 2012/0119260

SUMMARY

Technical Problem

According to the configuration described in PTL 1 described above, the parasitic capacitance between gate electrode 140x and the drain electrode can be reduced by insulating layer 130x sandwiched between T-type gate electrode 140x and AlGaN layer 104x. On the other hand, the configuration illustrated in FIG. 19 is insufficient for electric field relaxation. More specifically, in T-type gate electrode 140x, a high electric field tends to concentrate locally at the end portion of the portion of gate electrode 140x that projects above insulating layer 130x on the drain electrode side. As described above, there is a first problem that it is not possible to achieve both electric field relaxation and reduction of parasitic capacitance.

In addition, in T-type gate electrode 140x, the electron density of two-dimensional electron gas 110x increases in the direction directly below insulating layer 130x and sidewalls 133dx and 133sx, and thus the on-resistance can be lowered. On the other hand, with the configuration illustrated in FIG. 19, the off characteristic is reduced. More specifically, when the transistor is off, the electric field generated in the direction directly below gate electrode 140x weakens, making it difficult for a depletion layer to expand. As a result, an off leakage current is likely to be generated between the source and the drain. As described above, there is a second problem that it is not possible to achieve both the lowering of the on-resistance and improvement of the off characteristic.

In view of the above, the present disclosure provides a semiconductor device that is capable of implementing at least one of (i) achieving both the electric field relaxation and the reduction of parasitic capacitance or (ii) achieving both the lowering of the on-resistance and the improvement of the off characteristic.

Solution to Problem

In order to achieve the above-described object, one aspect of a semiconductor device according to the present disclosure includes: a substrate; a channel layer disposed above the substrate and including a group III nitride semiconductor; a barrier layer disposed above the channel layer and including a group III nitride semiconductor with a bandgap larger than a bandgap of the channel layer; a source electrode and a drain electrode disposed above the barrier layer and spaced apart from each other in a first direction in a plan view of the substrate; a gate electrode disposed between the source electrode and the drain electrode and spaced apart from each of the source electrode and the drain electrode in the first direction; and an insulating layer disposed above the barrier layer and disposed between the gate electrode and the source electrode and between the gate electrode and the drain electrode. In the semiconductor device described above, the insulating layer includes a first insulating layer as a bottom layer and a second insulating layer located above the first insulating layer, the first insulating layer including silicon nitride, the second insulating layer including silicon oxide, the gate electrode includes: a junction portion that forms a Schottky junction with the barrier layer; and a first projecting portion and a second projecting portion in the first direction, the first projecting portion projecting toward the drain electrode from the junction portion, the second projecting portion projecting toward the source electrode from the junction portion, the insulating layer includes: a first sidewall between the first projecting portion and the barrier layer in a second direction perpendicular to a main surface of the substrate, the first sidewall being located at one end on a junction portion side of the insulating layer between the junction portion and the drain electrode; and a second sidewall between the second projecting portion and the barrier layer in the second direction, the second sidewall being located at an other end on the junction portion side of the insulating layer between the junction portion and the source electrode, the first projecting portion includes: a first electric field plate extending in a section from a first position to a second position in the plan view, the first position being at an end on the junction portion side of the first sidewall, the second position being at an end of the first sidewall on the drain electrode side; and a second electric field plate extending in a section from the second position to a third position in the plan view, the third position being at an end on the drain electrode side of the first projecting portion, the first insulating layer and the second insulating layer are stacked between the second electric field plate and the barrier layer, in a cross-section parallel to each of the first direction and the second direction and passing though the junction portion: a tangent line at the first position of a top surface of the first sidewall is inclined at a first elevation angle relative to the main surface; an angle formed between a highest position of a bottom surface of the first electric field plate and the main surface from a viewpoint of the first position is a second elevation angle; and an angle formed between an end on the drain electrode side of a lowest portion of a bottom surface of the second electric field plate on the drain electrode side and the main surface from the viewpoint of the first position is a third elevation angle, the second elevation angle is larger than the third elevation angle, and the bottom surface of the second electric field plate includes an inclined surface where a distance from the barrier layer monotonically increases in a direction from the gate electrode to the drain electrode.

In addition, another aspect of a semiconductor device according to the present disclosure includes: a substrate; a channel layer disposed above the substrate and including a group III nitride semiconductor; a barrier layer disposed above the channel layer and including a group III nitride semiconductor with a bandgap larger than a bandgap of the channel layer; a source electrode and a drain electrode disposed above the barrier layer and spaced apart from each other in a first direction in a plan view of the substrate; a gate electrode disposed between the source electrode and the drain electrode and spaced apart from each of the source electrode and the drain electrode in the first direction; and an insulating layer disposed above the barrier layer and disposed between the gate electrode and the source electrode and between the gate electrode and the drain electrode. In the semiconductor device described above, the insulating layer includes a first insulating layer as a bottom layer and a second insulating layer located above the first insulating layer, the first insulating layer including silicon nitride, the second insulating layer including silicon oxide, the gate electrode includes: a junction portion that forms a Schottky junction with the barrier layer; and a first projecting portion and a second projecting portion in the first direction, the first projecting portion projecting toward the drain electrode from the junction portion, the second projecting portion projecting toward the source electrode from the junction portion, the insulating layer includes: a first sidewall between the first projecting portion and the barrier layer in a second direction perpendicular to a main surface of the substrate, the first sidewall being located at one end on a junction portion side of the insulating layer between the junction portion and the drain electrode; and a second sidewall between the second projecting portion and the barrier layer in the second direction, the second sidewall being located at an other end on the junction portion side of the insulating layer between the junction portion and the source electrode, the first projecting portion includes: a first electric field plate extending in a section from a first position to a second position in the plan view, the first position being at an end on the drain electrode side of the first sidewall on the junction portion side, the second position being at an end of the first sidewall; and a second electric field plate extending in a section from the second position to a third position in the plan view, the third position being at an end on the drain electrode side of the first projecting portion, the first insulating layer and the second insulating layer are stacked between the second electric field plate and the barrier layer, in a cross-section parallel to each of the first direction and the second direction and passing though the junction portion: a tangent line at the first position of a top surface of the first sidewall is inclined at a first elevation angle relative to the main surface; an angle formed between a highest position of a bottom surface of the first electric field plate and the main surface from a viewpoint of the first position is a second elevation angle; and an angle formed between an end on the drain electrode side of a lowest portion of a bottom surface of the second electric field plate and the main surface from the viewpoint of the first position is a third elevation angle, and a highest position of the top surface of the first sidewall is located below a highest position of a top surface of the second sidewall.

Advantageous Effects

With the semiconductor device according to the present disclosure, it is possible to implement at least one of (i) achieving both the electric field relaxation and the reduction of parasitic capacitance or (ii) achieving both the lowering of the on-resistance and the improvement of the off characteristic.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2 is an enlarged cross-sectional view illustrating a configuration of a gate electrode of the semiconductor device according to Embodiment 1.

FIG. 3 is an enlarged cross-sectional view illustrating a shape of a bottom surface of a projecting portion of the gate electrode on the drain electrode side of the semiconductor device according to Embodiment 1.

FIG. 4A is a cross-sectional view illustrating a process of a method of manufacturing the semiconductor device according to Embodiment 1.

FIG. 4E is a cross-sectional view illustrating a process of the method of manufacturing the semiconductor device according to Embodiment 1.

FIG. 4F is a cross-sectional view illustrating a process of the method of manufacturing the semiconductor device according to Embodiment 1.

FIG. 5 is a cross-sectional view illustrating a configuration of a gate electrode of a semiconductor device according to Variation 1 of Embodiment 1.

DESCRIPTION OF EMBODIMENTS

Figure 1:
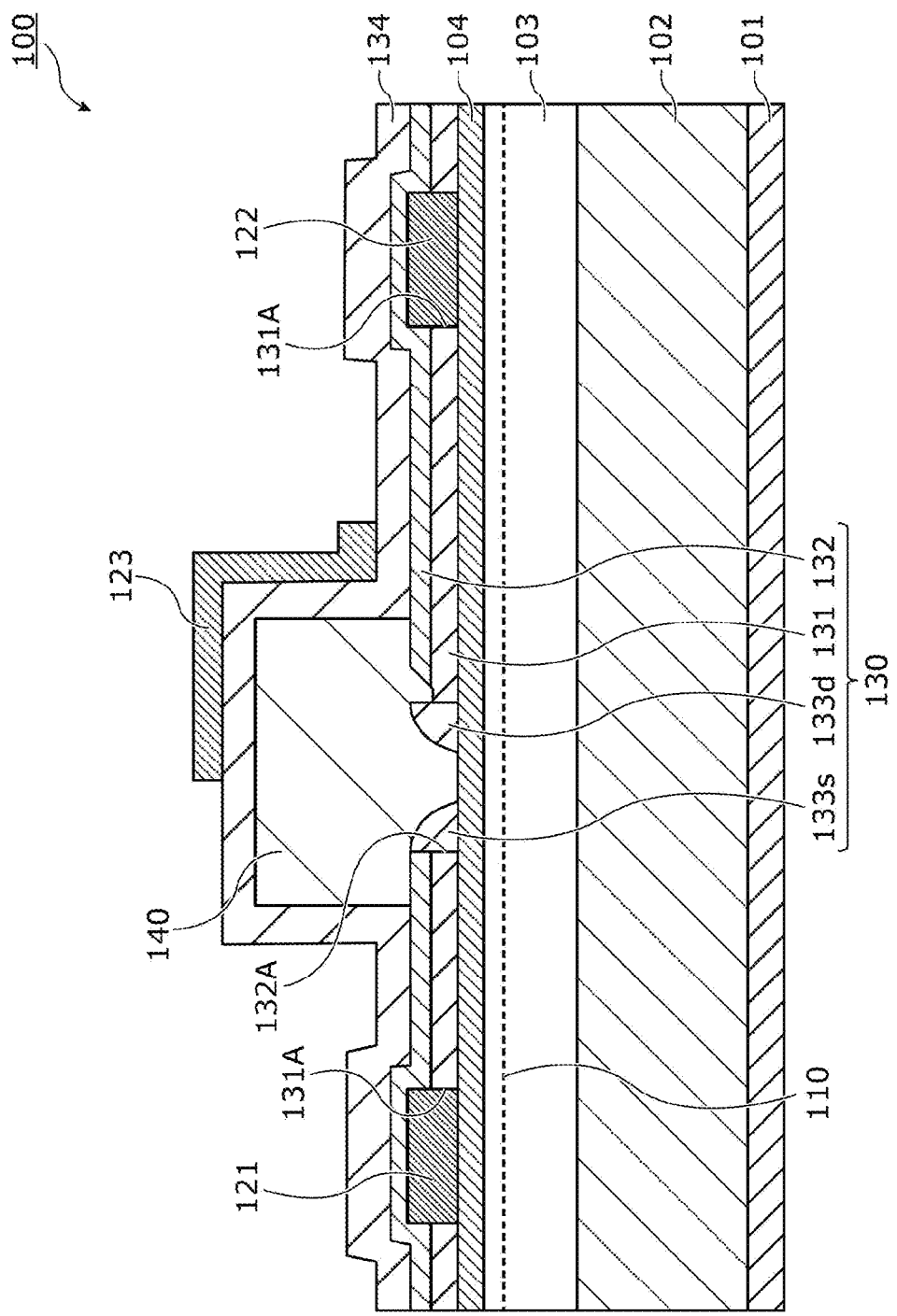
FIG. 1 is a cross-sectional view illustrating a configuration of a semiconductor device according to Embodiment 1.

The following describes specific embodiments of a semiconductor device, etc. according to one aspect of the present disclosure, with reference to the drawings.

Each of the exemplary embodiments described below shows one specific example of the present disclosure. As such, the numerical values, shapes, materials, structural components, the arrangement and connection of the structural components, steps, the processing order of the steps etc. described in the following embodiments are mere examples, and therefore do not limit the scope of the present disclosure. Among the structural components in the embodiments described below, those not recited in the independent claims will be described as optional structural components.

The drawings are schematically illustrated diagrams and do not necessarily give strict illustration. Throughout the drawings, the same numeral is given to substantially the same structural component, and redundant description will be omitted or simplified.

In addition, in this Specification, terms indicating relationships between elements, such as parallel or perpendicular, and terms indicating the shapes of elements, such as quadrilateral, as well as value ranges do not have the meanings in the strict sense only, but also represent essentially equivalent meanings and value ranges, and include, for example, deviations of about a few percent.

Moreover, in this Specification, the terms "above" and "below" used to describe a configuration of the semiconductor device do not refer to the vertically upward direction and vertically downward direction in terms of absolute spatial recognition, but are used as terms defined by relative positional relationships based on the stacking order in a stacked structure. In addition, the terms "above" and "below" are used not only when a structural component is present between two other structural components spaced apart from each other, but also when two structural components are disposed in close contact with each other.

In addition, in this Specification and Drawings, the X-axis, the Y-axis, and the Z-axis refer to the three axes of a three-dimensional orthogonal coordinate system. In each of the embodiments, the X-axis and the Y-axis are the two axes parallel to the main surface (top surface) included in a substrate that the semiconductor device includes, and the direction perpendicular to this main surface is a Z-axis direction. More specifically, the direction in which the source electrode, the gate electrode, and the drain electrode are aligned in stated order; that is, the so-called gate length direction is referred to as the X-axis direction. The X-axis direction is one example of the first direction. The Z-axis direction is one example of the second direction. In the embodiments described below, there are instances where the Z-axis positive direction is described as "above" and the Z-axis negative direction is described as "below". In addition, in this Specification, "plan view" refers to the view of the main surface (top surface) of the substrate included in the semiconductor device from the Z-axis positive direction, unless otherwise specified.

In addition, in this Specification, a group III nitride semiconductor is a semiconductor that contains one or more types of group III elements and nitrogen. Group III elements are, for example, aluminum (Al), gallium (Ga), indium (In), etc. GaN, AlN, InN, AlGaN, InGaN, and AlInGaN are included as examples of the group III nitride semiconductor. Group III nitride semiconductors may contain one or more types of elements other than Group III, such as silicon (Si) and phosphorus (P). It should be noted that, in the following description, when a group III nitride semiconductor is described as AlInGaN without any particular explanation, it means that the group III nitride semiconductor contains each of Al, In, Ga, and N. The same applies to other descriptions such as AlGaN and GaN.

In addition, a layer consisting of a group III nitride semiconductor and a layer composed of a group III nitride semiconductor each mean that the layer contains substantially only a group III nitride semiconductor. However, the above-described layer may contain other elements, as impurities, such as elements that cannot be avoided in the manufacturing process, at a ratio of 1 at % or less.

In addition, in this Specification, the composition ratio of the group III element of a nitride semiconductor (layer) represents the ratio of a total number of atoms of the target group III element among a plurality of group III elements included in the nitride semiconductor. For example, when a nitride semiconductor layer consisting of $Al_aIn_bGa_cN$ (a+b+c=1, a≥0, b≥0, c≥0), the Al composition ratio of the nitride semiconductor layer can be expressed as a/(a+b+c). In the same manner, the In composition ratio and the Ga composition ratio are expressed as b/(a+b+c) and c/(a+b+c), respectively.

In addition, in this Specification, ordinal numerals such as "first" and "second" do not mean a total number or an order of structural components, unless otherwise noted, but are used to avoid confusion and distinguish between structural components of the same type.

Embodiment 1

First, a semiconductor device according to Embodiment 1 will be described with reference to FIG. 1 to FIG. 3.

FIG. 1 is a cross-sectional view illustrating a configuration of semiconductor device 100 according to Embodiment 1. FIG. 2 is an enlarged cross-sectional view illustrating a configuration of gate electrode 140 of semiconductor device 100 according to Embodiment 1. FIG. 3 is an enlarged cross-sectional view illustrating a shape of bottom surface 144a of projecting portion 142d of gate electrode 140 on the drain electrode 122 side of semiconductor device 100 according to Embodiment 1. It should be noted that FIG. 1 to FIG. 3 each represent a cross-section (XZ cross-section) in the direction in which source electrode 121 and drain electrode 122 are aligned (X-axis direction), and which is perpendicular to the main surface of substrate 101 and passes through junction portion 141 where gate electrode 140 and barrier layer 104 form a Schottky junction with each other. The same is true for the other cross-sectional views of FIG. 4A and subsequent diagrams.

In the present embodiment, the case in which semiconductor device 100 is a high electron mobility transistor (HEMT) having a Schottky junction gate structure is described.

As illustrated in FIG. 1, semiconductor device 100 includes substrate 101, buffer layer 102, channel layer 103, barrier layer 104, two-dimensional electron gas 110, source electrode 121, drain electrode 122, source field plate 123, T-type gate electrode 140, insulating layer 130, and fourth insulating layer 134. Insulating layer 130 includes first insulating layer 131, second insulating layer 132, first sidewall 133d, and second sidewall 133s.

Substrate 101 is, for example, a substrate consisting of Si. Substrate 101 is not limited to the substrate consisting of Si, but may be a substrate consisting of sapphire, SiC, GaN, AlN, or the like.

Buffer layer 102 is disposed above substrate 101. For example, buffer layer 102 is disposed in contact with the top surface of substrate 101. Buffer layer 102 is, for example, a layer consisting of a group III nitride semiconductor. As an example, buffer layer 102 has a stacked structure consisting of a plurality of layers of AlN and AlGaN with a thickness of 2 μm. Buffer layer 102 may otherwise include a single layer or a plurality of layers of group III nitride semiconductors such as GaN, AlGaN, AlN, InGaN, AlInGaN, etc. Buffer layer 102 need not necessarily be provided.

Channel layer 103 is disposed above substrate 101. For example, channel layer 103 is disposed in contact with the top surface of buffer layer 102. Channel layer 103 is a layer consisting of a group III nitride semiconductor. Channel layer 103 includes, for example, GaN with a thickness of 200 nm. It should be noted that channel layer 103 is not limited to GaN, but may include a group III nitride semiconductor such as InGaN, AlGaN, AlInGaN, etc. In addition, channel layer 103 may contain an n-type impurity. The thickness of channel layer 103 is not limited to the example described above.

Barrier layer 104 is disposed above channel layer 103. For example, barrier layer 104 is disposed in contact with the top surface of channel layer 103. Barrier layer 104 is a layer consisting of a group III nitride semiconductor with a larger band gap than a band gap of channel layer 103. Barrier layer 104 includes, for example, AlGaN with a thickness of 20 nm and an Al composition ratio of 25%. A high-concentration two-dimensional electron gas 110 is generated on the channel layer 103 side of the hetero interface between barrier layer 104 and channel layer 103. Two-dimensional electron gas 110 is used as a channel for the transistor.

It should be noted that barrier layer 104 is not limited to AlGaN, but may include a group III nitride semiconductor such as AlInGaN, etc. In addition, barrier layer 104 may contain an n-type impurity. The thickness and the Al composition ratio of barrier layer 104 are not limited to the examples described above.

It should be noted that a cap layer consisting of, for example, GaN with a thickness of approximately 1 nm or more and approximately 2 nm or less may be disposed as a cap layer above barrier layer 104. In addition, a spacer layer consisting of, for example, AlN with a thickness of approximately 1 nm may be disposed as a spacer layer between channel layer 103 and barrier layer 104. As described above, channel layer 103 and barrier layer 104 need not necessarily be in contact with each other.

Source electrode 121 and drain electrode 122 are disposed with a gap therebetween above barrier layer 104. More specifically, source electrode 121 and drain electrode 122 are disposed facing each other with gate electrode 140 interposed therebetween.

Source electrode 121 and drain electrode 122 are formed using conductive materials. For example, source electrode 121 and drain electrode 122 are multilayer electrode films having a stacked structure in which a Ti film and an Al film are stacked in sequence, but not limited to this example. It should be noted that source electrode 121 and drain electrode 122 are not limited to the stacked structure of a Ti film and an Al film, but may be a transition metal, a nitride or a carbide of a transition metal deposited by sputtering. More specifically, source electrode 121 and drain electrode 122 may be Ta, Hf, W, Ni, TiN, TaN, HfN, WN, TiC, TaC, HfC, Au, Cu, etc., a compound containing these elements, or a multilayer electrode film having a plurality of stacked structures.

In addition, source electrode 121 and drain electrode 122 are each electrically in ohmic contact with two-dimensional electron gas 110.

It should be noted that a recess where a portion of barrier layer 104 and/or channel layer 103 is removed, or a contact layer containing n-type impurities such as Si or other donors may be provided below at least one of source electrode 121 or drain electrode 122. The contact layer containing n-type impurities may be formed by, for example, plasma treatment, ion implantation, regrowth, or the like.

Insulating layer 130 is disposed above barrier layer 104 and disposed between gate electrode 140 and source electrode 121 and between gate electrode 140 and drain electrode 122. As illustrated in FIG. 1, insulating layer 130 includes first insulating layer 131, second insulating layer 132, first sidewall 133d, and second sidewall 133s.

First insulating layer 131 is a bottom layer located at the lowest in insulating layer 130. First insulating layer 131 is disposed above barrier layer 104. For example, first insulating layer 131 is disposed in contact with the top surface of barrier layer 104. First insulating layer 131 is a layer consisting of silicon nitride. For example, first insulating layer 131 includes $Si_3N_4$ with a thickness of 50 nm. In addition, as illustrated in FIG. 1, first insulating layer 131 is provided with first opening portion 131A that penetrates through first insulating layer 131 to reach barrier layer 104 in the region in which source electrode 121 and drain electrode 122 are provided.

First insulating layer 131 may be in a stoichiometric composition of $Si_3N_4$ with low H content, for example. With this configuration, it is possible to reduce electron trapping and selectively remove second insulating layer 132 by wet etching. It should be noted that first insulating layer 131 is not limited to $Si_3N_4$ and does not have to be in a stoichiometric composition, and may have a larger Si composition ratio or a larger N composition ratio compared to the stoichiometric composition. First insulating layer 131 may be multiple layers instead of a single layer. In first insulating layer 131 of multiple layers, $Si_3N_4$ is used in the bottom layer and the upper layer may be SiN with a larger Si composition ratio or a larger N composition ratio compared to the stoichiometric composition, to control the etch rate of wet etching. In addition, first insulating layer 131 may be SiCN containing carbon.

Second insulating layer 132 is disposed above first insulating layer 131. More specifically, second insulating layer 132 is disposed in contact with the top surface of each of first insulating layer 131, source electrode 121, and drain electrode 122. Second insulating layer 132 is a layer consisting of a silicon oxide. For example, second insulating layer 132 includes $SiO_2$ with a thickness of 50 nm. It should be noted that second insulating layer 132 is not limited to $SiO_2$, as long as second insulating layer 132 has a dielectric constant lower than a dielectric constant of first insulating layer 131. In addition, it is sufficient if second insulating layer 132 can be selectively removed with respect to first insulating layer 131. More specifically, second insulating layer 132 may be SiON with oxygen contained in SiN, a low-k film such as SiOC and SiOCH, or an organic film.

As illustrated in FIG. 1, second opening portion 132A that penetrates through first insulating layer 131 and second insulating layer 132 to reach barrier layer 104 is provided between source electrode 121 and drain electrode 122. Second opening 132A is defined, for example, to have a width of 400 nm. The width of second opening portion 132A may be in a range of from 100 nm to 600 nm.

As a result of second opening portion 132A being provided, as illustrated in FIG. 2, first insulating layer 131 and second insulating layer 132 can be divided into a portion on the drain electrode 122 side and a portion on the source electrode 121 side in a cross-sectional view. More specifically, first insulating layer 131 includes first insulating layer 131d on the drain electrode 122 side and first insulating layer 131s on the source electrode 121 side. Second insulating layer 132 includes second insulating layer 132d on the drain electrode 122 side and second insulating layer 132s on the source electrode 121 side. According to the present embodiment, the top surface shape of first insulating layer 131d and second insulating layer 132d on the drain electrode 122 side is different from the top surface shape of first insulating layer 131s and second insulating layer 132s on the source electrode 121 side. The specific shape differences will be explained later.

Although first insulating layer 131s and first insulating layer 131d have the same thickness and layer composition, they are not limited to this, and at least one of the thickness or the composition may be different. For example, the thickness of first insulating layer 131s may be greater than the thickness of first insulating layer 131d. Although second insulating layer 132s and second insulating layer 132d have the same thickness and layer composition, they are not limited to this, and at least one of the thickness or the composition may be different.

In the description below, when things common to first insulating layer 131s and first insulating layer 131d are described, the description is given assuming as first insulating layer 131s and first insulating layer 131d being first insulating layer 131. The same applies to second insulating layer 132s and second insulating layer 132d.

As illustrated in FIG. 2, first sidewall 133d and second sidewall 133s are provided between barrier layer 104 and projecting portions 142d and 142s of gate electrode 140. Specifically, first sidewall 133d and second sidewall 133s are provided within second opening portion 132A. More specifically, first sidewall 133d is provided at the end portion of insulating layer 130 on the junction portion 141 side between junction portion 141 of gate electrode 140 and drain electrode 122. Second sidewall 133s is provided at the end portion of insulating layer 130 on the junction portion 141 side between junction portion 141 and source electrode 121. In other words, first sidewall 133d is provided in contact with the side face of first insulating layer 131d on the junction portion 141 side. Second sidewall 133s is provided in contact with each of the side faces of first insulating layer 131s and second insulating layer 132s on the junction portion 141 side.

First sidewall 133d and second sidewall 133s include SiN with a width of 100 nm, for example. Here, SiN generally has tensile stress. As a result of first sidewall 133d and second sidewall 133s being provided, it is possible to substantially narrow the opening area of second opening portion 132A. For example, the width of the exposed portion of barrier layer 104 is 200 nm. It should be noted that first sidewall 133d and second sidewall 133s may have an arbitrary width in a range of from 20 nm to 200 nm. First sidewall 133d and second sidewall 133s may be different in width (length in the X-axis direction).

It should be noted that first sidewall 133d may be formed using a high dielectric material. With this configuration, it is possible to further reduce the electric field at an end on the drain electrode 122 side of the portion (junction portion 141) where gate electrode 140 and barrier layer 104 are in contact with each other. In addition, second sidewall 133s may be formed using a low dielectric material. With this configuration, it is possible to reduce the parasitic capacitance between gate electrode 140 and source electrode 121 (gate-source capacitance Cgs).

As illustrated in FIG. 1, gate electrode 140 is disposed between source electrode 121 and drain electrode 122 to be spaced apart from each of source electrode 121 and drain electrode 122. Gate electrode 140 has a so-called T-type gate structure. More specifically, gate electrode 140 is disposed above barrier layer 104 exposed at the bottom of second opening portion 132A and portions of first insulating layer 131 and second insulating layer 132 to cover second opening portion 132A.

As illustrated in FIG. 2, gate electrode 140 includes junction portion 141 that forms a Schottky junction with barrier layer 104. According to the present embodiment, junction portion 141 is a contact surface where gate electrode 140 and barrier layer 104 are in contact with each other. Junction portion 141 corresponds to the portion between first sidewall 133d and second sidewall 133s in a plan view. The length of junction portion 141 in the X-axis direction corresponds to so-called gate length Lg. Gate length Lg can be shortened by first sidewall 133d and second sidewall 133s.

Gate electrode 140 includes projecting portions that respectively project toward the source electrode 121 side and the drain electrode 122 side from junction portion 141 when the main surface of substrate 101 is viewed in a plan view. More specifically, as illustrated in FIG. 2, gate electrode 140 includes projecting portion 142s that projects toward the source electrode 121 side from junction portion 141 when viewed in a plan view of substrate 101 and projecting portion 142d that projects toward the drain electrode 122 side from junction portion 141 when viewed in a plan view of substrate 101. Projecting portions 142d and 142s correspond to the arm portions of the T-type gate structure (the crossbar portion of the T-shape), and junction portion 141 corresponds to the sole portion of the T-type gate structure (the lower end of the vertical bar of the T-shape). Projecting portions 142d and 142s are located above insulating layer 130 and not in contact with barrier layer 104.

According to the present embodiment, as illustrated in FIG. 2 and FIG. 3, the bottom surface of projecting portion 142d on the drain electrode 122 side is not flat. In the cross-sectional view, the bottom surface of projecting portion 142d varies in a cubic-function manner. The specific shape of the bottom surface of projecting portion 142d will be explained later.

Gate electrode 140 is formed using a conductive material. Gate electrode 140 is, for example, a multilayer electrode film having a stacked structure in which a TiN film and an Al film are stacked in sequence. For example, the thickness of the TiN film is 50 nm and the thickness of the Al film is 500 nm, but are not limited to these examples. It should be noted that gate electrode 140 is not limited to the multilayer structure of a TiN film and an Al film, but may be a nitride or carbide of transition metal deposited by sputtering. More specifically, gate electrode 140 may be Ni, TiN, WN, HfN, TiC, WC, HfC, W, Au, Cu, etc., a compound containing these elements, or a multilayer electrode film having a plurality of stacked structures.

Fourth insulating layer 134 is disposed above second insulating layer 132 and gate electrode 140. Fourth insulating layer 134 includes SiN with a thickness of 150 nm, for example. It should be noted that fourth insulating layer 134 is not limited to SiN, but may be $SiO_2$ or SiCN. In addition, SiN included in fourth insulating layer 134 may be stress controlled by changing the Si composition ratio or the N composition ratio.

Source field plate 123 is a source electric field plate disposed above gate electrode 140 and set at the same electric potential as source electrode 121. More specifically, source field plate 123 is disposed above fourth insulating layer 134. Source field plate 123 is disposed such that at least a portion thereof is positioned between gate electrode 140 and drain electrode 122 in a plan view. In the example illustrated in FIG. 1, source field plate 123 is placed such that a portion thereof overlaps gate electrode 140 in a plan view. Source field plate 123 is electrically insulated from gate electrode 140 and drain electrode 122, and is set at an electric potential (source electric potential) applied to source electrode 121. As a result of source field plate 123 being provided, it is possible to relax the electric field concentrated on gate electrode 140.

Source field plate 123 is formed using a conductive material. Source field plate 123 is, for example, a multilayer electrode film having a stacked structure in which a TiN film and an Al film are stacked in sequence. For example, the thickness of the TiN film is 50 nm and the thickness of the Al film is 500 nm, but are not limited to these examples. It should be noted that source field plate 123 is not limited to the multilayer structure of a TiN film and an Al film, but may be a nitride or carbide of transition metal deposited by sputtering. More specifically, source field plate 123 may be Ti, Ta, W, Ni, TiN, TaN, WN, W, Au, Cu, etc., a compound containing these elements, or a multilayer electrode film having a plurality of stacked structures.

Next, the detailed structures of gate electrode 140 and first insulating layer 131d and second insulating layer 132d on the drain electrode 122 side will be described with reference to FIG. 2 and FIG. 3. As illustrated in FIG. 2 and FIG. 3, projecting portion 142d of gate electrode 140 on the drain electrode 122 side includes first gate field plate 143 and second gate field plate 144.

First gate field plate 143 is an example of the first electric field plate, and is the section from the first position to the second position. The first position is at an end on the junction portion 141 side of first sidewall 133d in the plan view of substrate 101. The second position is at an end on the drain electrode 122 side of first sidewall 133d in the plan view of substrate 101. The first position is also the position of the end on the drain electrode 122 side of the portion (junction portion 141) where gate electrode 140 and barrier layer 104 are in contact with each other. First gate field plate 143 is the portion of projecting portion 142d that is located in the direction directly above first sidewall 133d, that is, the section overlapping first sidewall 133d in a plan view.

As illustrated in FIG. 2, bottom surface 143a of first gate field plate 143 is in contact with top surface 133da of first sidewall 133d. Top surface 133da of first sidewall 133d is curved to protrude upwardly. Bottom surface 143a of first gate field plate 143 is curved along top surface 133da. Bottom surface 143a is inclined (curved) such that the distance from barrier layer 104 increases monotonically in the X-axis positive direction. It should be noted that top surface 133da and bottom surface 143a may be inclined planar surfaces or may be formed in a staircase shape. Similarly, top surface 133sa of second sidewall 133s may be an inclined planar surface instead of a curved surface or may be formed in a staircase shape.

Second gate field plate 144 is an example of the second electric field plate, and is the section from the above-described second position to the third position which is at an end on the drain electrode 122 side of projecting portion 142d, in a plan view of substrate 101. Second gate field plate 144 is the portion of projecting portion 142d that is located in the direction directly above first insulating layer 131, that is, the section overlapping first insulating layer 131 in a plan view. According to the present embodiment, first insulating layer 131d and second insulating layer 132d are stacked between second gate field plate 144 and barrier layer 104.

As illustrated in FIG. 2, bottom surface 144a of second gate field plate 144 includes flat surface 144b, inclined surface 144c, and flat surface 144d. It should be noted that bottom surface 144a need not necessarily include at least one of flat surface 144b or flat surface 144d.

Flat surface 144b is a plane (XY plane) parallel to the main surface of substrate 101, and is in contact with the surface of first insulating layer 131d. According to the present embodiment, flat surface 144b is located below the interface between first insulating layer 131d and second insulating layer 132d, but is not limited to this. Flat surface 144b may be flush with the interface between first insulating layer 131d and second insulating layer 132d.

Inclined surface 144c is a surface where the distance from barrier layer 104 increases monotonically in the X-axis positive direction. Inclined surface 144c is in contact with the end face of the source electrode 121 side of second insulating layer 132d and the side wall of the recess of first insulating layer 131d. Inclined surface 144c is a plane inclined with respect to the main surface of substrate 101. Inclined surface 144c may be an upwardly or downwardly protruding curved surface. The angle of inclination (angle made with respect to the XY plane) of inclined surface 144c is not particularly limited, but is, for example, within the range of 45 degrees±5 degrees, inclusive.

Flat surface 144d is a plane (XY plane) parallel to the main surface of substrate 101, and is in contact with the top surface second insulating layer 132d.

Bottom surface 144a of the shape described above can be defined by the elevation angle when viewed from position P1 that is the end on the drain electrode 122 side of junction portion 141 of gate electrode 140. The following describes first elevation angle θ1 through fifth elevation angle θ5, virtual lines VL1 through VL5, and positions P1 through P5 for defining each elevation angle, with reference to FIG. 3.

First elevation angle θ1 to fifth elevation angle θ5 are each an elevation angle relative to the main surface (XY plane) of substrate 101 when, from one predetermined position (point), another predetermined position (point) or a predetermined direction is viewed in the cross-sectional view illustrated in FIG. 3. More specifically, first elevation angle θ1 to fifth elevation angle θ5 are represented as the angles (<90 degrees) formed between the main surface (XY plane) of substrate 101 and virtual lines VL1 to VL5, respectively, illustrated in FIG. 3.

As illustrated in FIG. 3, virtual line VL1 is a tangent line at position P1 of top surface 133da of first sidewall 133d. Virtual line VL2 is a straight line connecting position P1 and position P2. Virtual line VL3 is a straight line connecting position P1 and position P3. Virtual line VL4 is a straight line connecting position P1 and position P4. Virtual line VL5 is a straight line connecting position P3 and position P4.

Position P1 is the end on the junction portion 141 side of first sidewall 133d. More specifically, position P1 is an example of the first position, and is also the end on the drain electrode 122 side of junction portion 141.

Position P2 is the highest position of bottom surface 143a of first gate field plate 143. More specifically, position P2 is also the highest position of top surface 133da of first sidewall 133d.

Position P3 is the end on the drain electrode 122 side of a lowest portion of bottom surface 144a (see FIG. 2) of second gate field plate 144. More specifically, position P3 is the end on the drain electrode 122 side of flat surface 144b. According to the present embodiment, position P3 is also a lower end of inclined surface 144c.

Position P4 is the end on the drain electrode 122 side of the highest portion of bottom surface 144a (see FIG. 2) of second gate field plate 144. More specifically, position P4 is the end on the drain electrode 122 side of flat surface 144d.

Position P5 is the upper end of inclined surface 144c. According to the present embodiment, position P5 is also the end on the junction portion 141 side of the highest portion of bottom surface 144a of second gate field plate 144.

Figure 19:
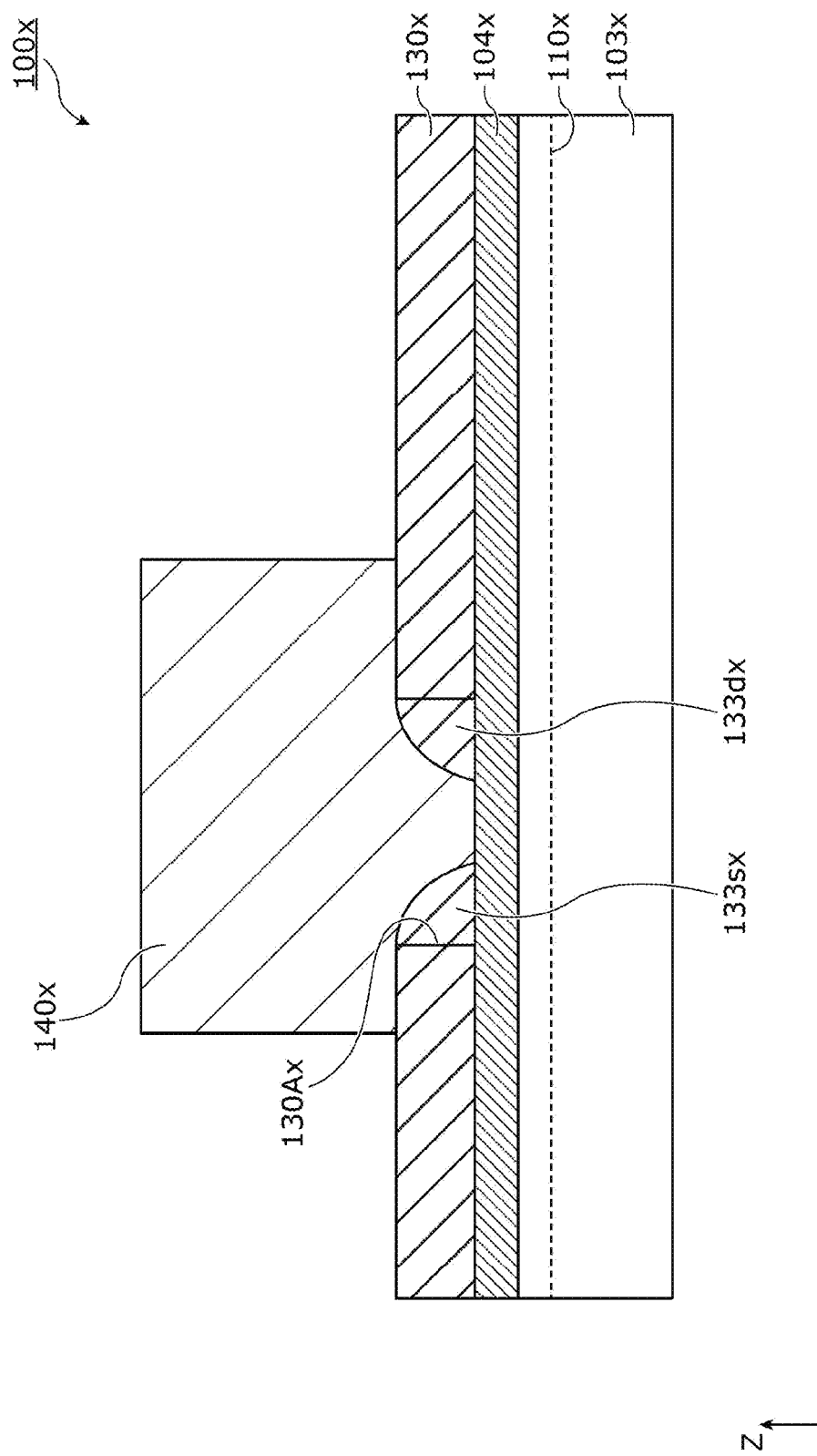
FIG. 19 is a cross-sectional view illustrating a configuration of a gate electrode according to a conventional technique.

According to the present embodiment, second elevation angle θ2 is larger than third elevation angle θ3. With this configuration, the lowest position (position P3) of bottom surface 144a of second gate field plate 144 is lower than the highest position (position P2) of first sidewall 133d, compared to the configuration of the conventional technique illustrated in FIG. 19. In addition, the bottom surface of projecting portion 142d of gate electrode 140 on the drain electrode 122 side includes inclined surface 144c where the distance from barrier layer 104 monotonically increases toward the drain electrode 122 side in the X-axis direction.

With this configuration, it is possible to disperse the electric field concentration that is concentrated locally at the end (position P1) on the drain electrode 122 side of the portion where gate electrode 140 and barrier layer 104 are in contact with each other (junction portion 141) not only to position P4 but also to position P3 and inclined surface 144c. As a result, it is possible to implement electric field relaxation.

Moreover, since the lowest position (P3) of the bottom surface of second gate field plate 144 is lower than the highest position (P2) of top surface 133da of first sidewall 133d, the depletion layer easily expands to the drain electrode 122 side below gate electrode 140 when the transistor is off. For this reason, when the applied voltage between gate electrode 140 and drain electrode 122 is at a low voltage, the position of two-dimensional electron gas 110 is located closer to drain electrode 122, i.e., away from gate electrode 140, compared to the conventional technique. As a result, the area where two-dimensional electron gas 110 faces gate electrode 140 is reduced. In addition, when second elevation angle θ2 is larger than third elevation angle θ3, the distance between two-dimensional electron gas 110 and first gate field plate 143 can be elongated, and thus it is possible to reduce parasitic capacitance (gate-drain capacitance Cgd).

As described above, with semiconductor device 100 according to the present embodiment, it is possible to achieve both the reduction in the electric field intensity and the reduction in parasitic capacitance.

It should be noted that, as illustrated in FIG. 2, a portion of projecting portion 142s located between source electrode 121 and second sidewall 133s is not located below the highest position (position P2) of first sidewall 133d. With this configuration, it is possible to inhibit the increase in parasitic capacitance between gate electrode 140 and source electrode 121.

In addition, as illustrated in FIG. 3, fifth elevation angle θ5 is smaller than second elevation angle θ2. In this manner, by making fifth elevation angle θ5 small, it is possible to make the inclination from position P3 to position P4 gentle. As a result, it is possible to relax the electric field at the end (position P3) on the drain electrode 122 side of the lowest portion of bottom surface 144a of second gate field plate 144, to reduce the undulation of the electric field.

In addition, at least one of first insulating layer 131d or second insulating layer 132d may be thinner than the thickness of first insulating layer 131s and second insulating layer 132s on the source electrode 121 side. With this configuration, it is possible to further reduce the electric field intensity by dispersing the electric field concentration that is concentrated locally at the end (position P1) on the drain electrode 122 side of the portion where junction portion 141 of gate electrode 140 and barrier layer 104 are in contact with each other.

As described above, semiconductor device 100 according to the present embodiment includes: substrate 101; channel layer 103 disposed above substrate 101 and consisting of a group III nitride semiconductor; barrier layer 104 disposed above channel layer 103 and including a group III nitride semiconductor with a bandgap larger than a bandgap of channel layer 103; source electrode 121 and drain electrode 122 disposed above barrier layer 104 and spaced apart from each other in an X-axis direction of the main surface of substrate 101; gate electrode 140 disposed between source electrode 121 and drain electrode 122 and spaced apart from each of source electrode 121 and drain electrode 122 in the X-axis direction; and insulating layer 130 disposed above barrier layer 104 and disposed between gate electrode 140 and source electrode 121 and between gate electrode 140 and drain electrode 122. Insulating layer 130 includes first insulating layer 131 as a bottom layer and second insulating layer 132 located above first insulating layer 131. First insulating layer 131 consists of silicon nitride, and second insulating layer 132 including silicon oxide. Gate electrode 140 includes: junction portion 141 that forms a Schottky junction with barrier layer 104; projecting portion 142s projecting toward source electrode 121 from junction portion 141 in the X-axis direction, and projecting portion 142d projecting toward drain electrode 122 from junction portion 141 in the X-axis direction. Insulating layer 130 includes, between first projecting portion 142d and barrier layer 104 in a Z-axis direction perpendicular to the main surface of substrate 101: first sidewall 133d that is located at one end (end portion on the junction portion 141 side) on the junction portion 141 side of insulating layer 130 between junction portion 141 and drain electrode 122; and second sidewall 133s that is located at another end (end portion on the junction portion 141 side) of insulating layer 130 on the junction portion 141 side between junction portion 141 and source electrode 121. Projecting portion 142d includes: first gate field plate 143 extending in a section from a first position to a second position in the plan view; and second gate field plate 144 extending in a section from the second position to a third position in the plan view. The first position is at an end on the junction portion 141 side of first sidewall 133d, the second position is at an end on the drain electrode 122 side of first sidewall 133d, and the third position is at an end on the drain electrode 122 side of projecting portion 142d. First insulating layer 131d and second insulating layer 132d are stacked between second gate field plate 144 and barrier layer 104. In a cross-section (XZ cross-section) parallel to each of the X-axis direction and the Z-axis direction, and passing though junction portion 141: tangent line (virtual line VL1) at the first position (position P1) of top surface 133da of first sidewall 133d is inclined at first elevation angle θ1 relative to the main surface; an angle formed between a highest position (position P2) of bottom surface 143a of first gate field plate 143 and the main surface of substrate 101 from a viewpoint of the first position is second elevation angle θ2; and an angle formed between an end (position P3) on the drain electrode 122 side of a lowest portion of bottom surface 144a of second gate field plate 144 and the main surface of substrate 101 from a viewpoint of the first position is third elevation angle θ3. Second elevation angle θ2 is larger than third elevation angle θ3. Bottom surface 144a of second gate field plate 144 includes inclined surface 144c where a distance from barrier layer 104 monotonically increases in a direction from gate electrode 140 to drain electrode 122.

With this configuration, since two-dimensional electron gas 110 is generated in channel layer 103 in proximity to the interface with barrier layer 104, it is possible to implement a transistor using two-dimensional electron gas 110 generated as a channel. In addition, since gate electrode 140 includes junction portion 141 and projecting portion 142d, the implementation of the miniaturization of the gate length (Lg) and the electric field relaxation using projecting portion 142d are facilitated.

In addition, in semiconductor device 100, the lowest position (position P3) of bottom surface 144a of second gate field plate 144 is located below the highest position (position P2) of bottom surface 143a of first gate field plate 143. In addition, bottom surface 144a of second gate field plate 144 includes inclined surface 144c where a distance from barrier layer 104 monotonically increases.

With the above-described configurations, it is possible to disperse the electric field to the end (position P4) on the drain electrode 122 side of second gate field plate 144, the lowest position (position P3) of bottom surface 144a of second gate field plate 144, and inclined surface 144c, thereby enabling the relaxation of electric field concentration.

In addition, since second elevation angle θ2 is larger than third elevation angle θ3, first sidewall 133d becomes thick. With this configuration, it is possible to easily maintain the distance between two-dimensional electron gas 110 and projecting portion 142d of gate electrode 140 long, thereby enabling the reduction of the parasitic capacitance (gate-drain capacitance Cgd).

In addition, in the above-described configuration, a stacked film of first insulating layer 131d and second insulating layer 132d is provided between second gate field plate 144 and barrier layer 104. Second insulating layer 132d consists of a silicon oxide film with a lower relative permittivity than the silicon nitride film included in first insulating layer 131d, and thus it is possible to reduce the parasitic capacitance (gate-drain capacitance Cgd). As described above, with the above-described configuration, it is possible to achieve both the electric field relaxation and the parasitic capacitance reduction.

In addition, first insulating layer 131, first sidewall 133d, and second sidewall 133s each of which consists of a silicon nitride film are capable of compensating for the nitrogen deficiency in barrier layer 104 and reducing the interface state. For this reason, it is possible to reduce the off leakage current between gate electrode 140 and drain electrode 122.

In addition, for example, in semiconductor device 100, a portion of projecting portion 142s located between source electrode 121 and second sidewall 133s is not located below the highest position (position P2) of top surface 133da of first sidewall 133d.

With this configuration, it is possible to maintain the distance between two-dimensional electron gas 110 and projecting portion 142s of gate electrode 140 on the source electrode 121 side, thereby enabling the reduction of the parasitic capacitance (gate-source capacitance Cgs).

In addition, for example, in semiconductor device 100, in the cross-section illustrated in FIG. 3, fifth elevation angle θ5 is smaller than second elevation angle θ2. Fifth elevation angle θ5 is an angle formed between an end (position P4) of a highest portion of bottom surface 144a of second gate field plate 144 on the drain electrode 122 side and the main surface of substrate 101 from the viewpoint of the end (position P3) on the drain electrode side of the lowest portion of bottom surface 144a of second gate field plate 144.

With this configuration, it is possible to make the inclination from position P3 to position P4 gentle. As a result, it is possible to reduce the undulation of the electric field by relaxing the electric field at the end portion (position P3) on the drain electrode 122 side of the lowest portion of bottom surface 144a of second gate field plate 144.

In addition, in semiconductor device 100 according to the present variation, the inclined surface included by bottom surface 144a of second gate field plate 144 includes at least one inclined surface 144c with an angle of inclination relative to the main surface of substrate 101 within the range of 45 degrees±5 degrees, inclusive.

With this configuration, for example, it is possible to easily form the shape of the top surface of insulating layer 130 by an isotropic etching method such as wet etching. Since the shape of the bottom surface of projecting portion 142d of gate electrode 140 follows the shape of the top surface shape of insulating layer 130, it is possible to reduce the manufacturing variation of gate electrode 140, thereby enabling the implementation of a device with high reliability.

It should be noted that at least one of flat surface 144b or flat surface 144d may be inclined. The inclination may be an inclination where the distance from barrier layer 104 increases or decreases in the X-axis positive direction. In addition, the inclination may be flat or may be curved.

[Manufacturing Method]

The following describes a manufacturing method of semiconductor device 100 according to the present embodiment, with reference to FIG. 4A to FIG. 4G.

FIG. 4A to FIG. 4G are cross-sectional views for illustrating the processes of the manufacturing method of semiconductor device 100 according to the present embodiment. FIG. 4A to FIG. 4G each illustrate a cross-sectional configuration of semiconductor device 100 in the process of manufacturing. It should be noted that FIG. 4E and FIG. 4F each also illustrate an enlarged view of a portion in proximity to first sidewall 133d.

In addition, in FIG. 4A to FIG. 4D, three lines L1 to L3 extending in the Z-axis direction from the top surface of barrier layer 104 are indicated as dash-double-dot lines to facilitate understanding of the positional correspondence between the diagrams. Line L1 represents the position of the end on the drain electrode 122 side of first sidewall 233d. Line L2 represents the position of the end on the source electrode 121 side of second sidewall 133s. Line L3 represents the center position of junction portion 141.

First, as illustrated in FIG. 4A, above substrate 101 consisting of Si, buffer layer 102 having a thickness of 2 μm and a stacked structure of AlN and AlGaN, channel layer 103 having a thickness of 200 nm and including GaN, and barrier layer 104 having a thickness of 20 nm and including AlGaN with an Al composition ratio of 25% are formed by being epitaxially grown in the +c-plane direction (<0001> direction) in sequence using the method of metal organic chemical vapor deposition (MOCVD). As a result, a high-concentration two-dimensional electron gas 110 is generated on the channel layer 103 side of the hetero interface between barrier layer 104 and channel layer 103, thereby forming a channel of two-dimensional electron gas 110.

Figure 4B:
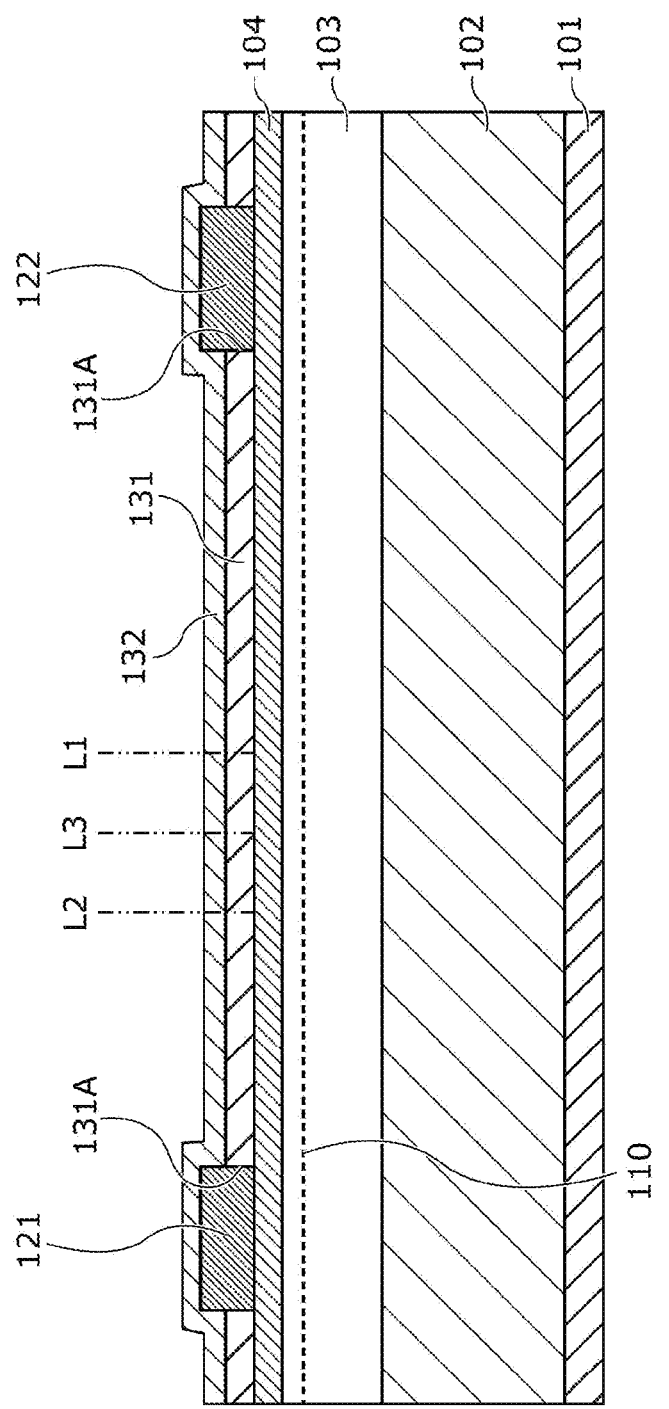
FIG. 4B is a cross-sectional view illustrating a process of the method of manufacturing the semiconductor device according to Embodiment 1.

Next, as illustrated in FIG. 4B, first insulating layer 131, source electrode 121, drain electrode 122, and second insulating layer 132 are formed. More specifically, first, first insulating layer 131 consisting of $Si_3N_4$ with a thickness of 50 nm is deposited by a reduced-pressure chemical vapor deposition (CVD) method. Furthermore, after a resist is applied, the resist is patterned by a lithography method to form a mask in a region other than a portion where source electrode 121 and drain electrode 122 are formed.

Next, a dry etching method is used to remove the mask and a polymer after first opening portion 131A is formed in first insulating layer 131 such that barrier layer 104 is exposed. It should be noted that, although the dry etching method is used in the present embodiment, the wet etching method may be used to form first opening portion 131A in first insulating layer 131.

Next, a Ti film and an Al film are deposited in sequence by vapor deposition, and then source electrode 121 and drain electrode 122 are formed by the lift-off method. Next, heat treatment is applied to cause two-dimensional electron gas 110 to be in electrically ohmic contact with each of source electrode 121 and drain electrode 122. It should be noted that, after the Ti film and the Al film are deposited in sequence by the sputtering method, source electrode 121 and drain electrode 122 may be formed by applying the lithography method and the dry etching method in sequence.

Next, second insulating layer 132 is formed above first insulating layer 131, source electrode 121, and drain electrode 122. Second insulating layer 132 is formed by depositing $SiO_2$ with a thickness of 50 nm by plasma CVD.

Figure 4C:
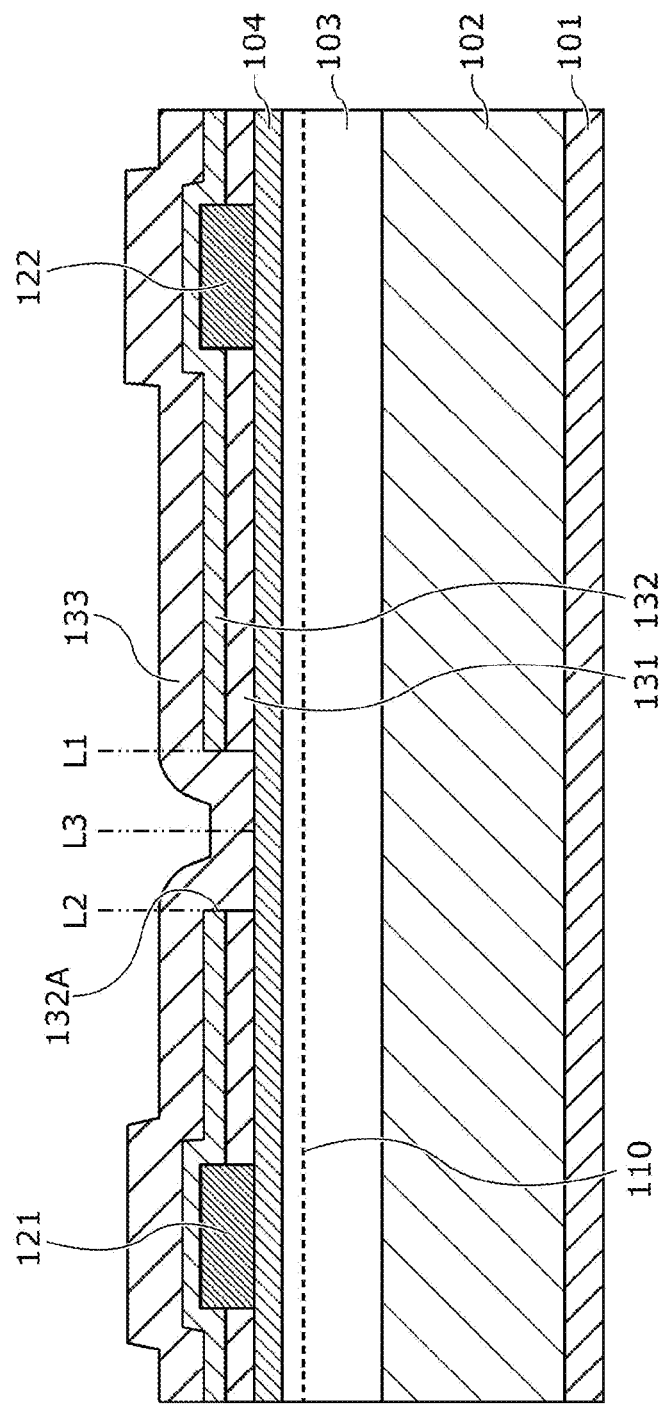
FIG. 4C is a cross-sectional view illustrating a process of the method of manufacturing the semiconductor device according to Embodiment 1.

Next, as illustrated in FIG. 4C, second opening portion 132A and third insulating layer 133 are formed. More specifically, first, a resist is applied, and then the resist is patterned by a lithographic method to form a mask in the region other than the portion where second opening portion 132A is formed. Next, a dry etching method is used to form second opening portion 132A in first insulating layer 131 and second insulating layer 132 such that barrier layer 104 is exposed. After second opening portion 132A is formed, the mask and the polymer are removed.

Next, third insulating layer 133 consisting of SiN with a thickness of 100 nm is deposited by the plasma CVD method. Third insulating layer 133 is provided to fill in second opening portion 132A.

Figure 4D:
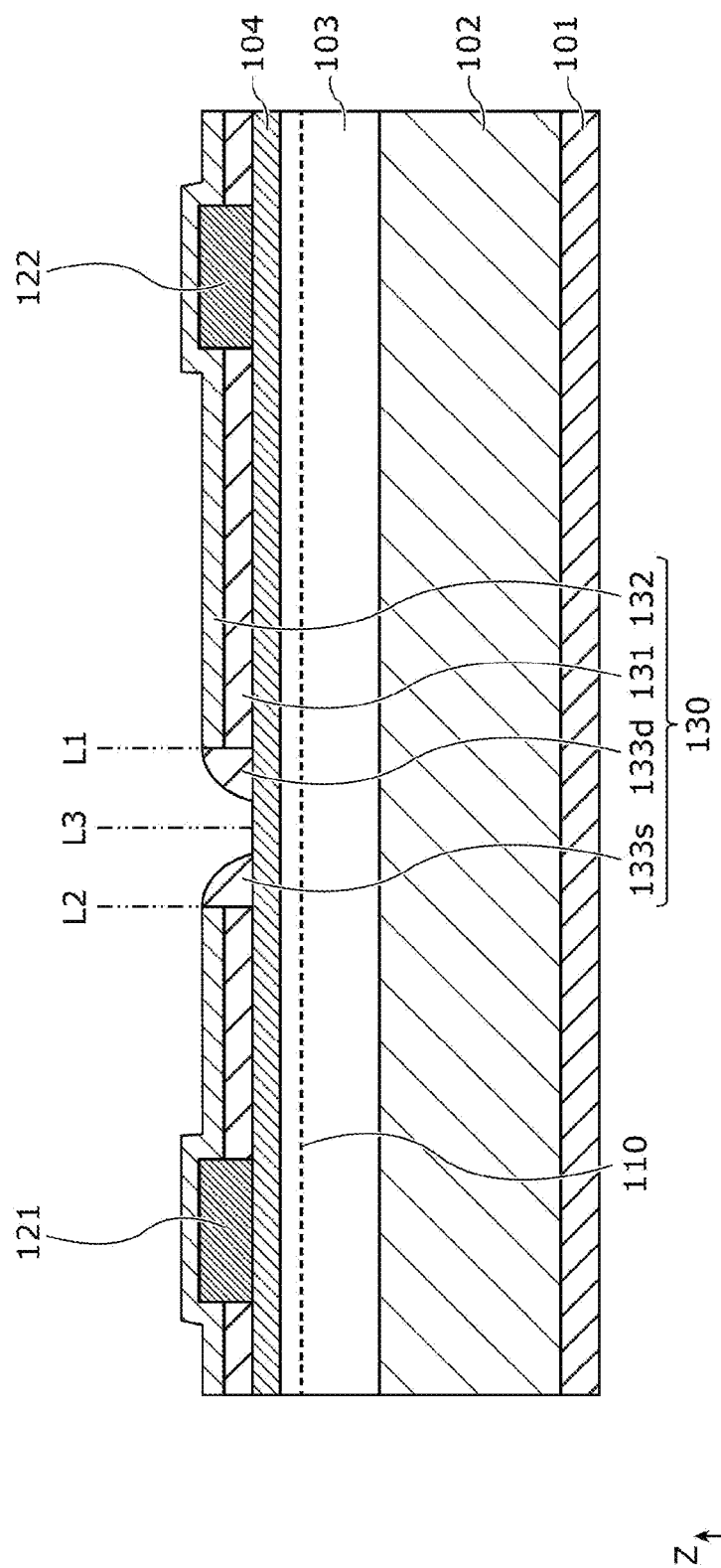
FIG. 4D is a cross-sectional view illustrating a process of the method of manufacturing the semiconductor device according to Embodiment 1.

Next, as illustrated in FIG. 4D, a dry etching method is used to etch back third insulating layer 133. As a result of this, first sidewall 133d and second sidewall 133s are formed such that barrier layer 104 is exposed.

Next, as illustrated in FIG. 4E, after the resist is applied, the resist is patterned by the lithography method to form a mask (resist pattern 150). The mask is formed to expose first sidewall 133d and second sidewall 133s. In the cross-sectional view illustrated in FIG. 4E, resist pattern 150 includes mask portion 151 on the drain electrode 122 side and mask portion 152 on the source electrode 121 side.

More specifically, in a plan view, the end portion of mask portion 151 of resist pattern 150 is located closer to drain electrode 122 than the end portion of first sidewall 133d on the drain electrode 122 side is. In other words, mask portion 151 is arranged to expose the end portion of second insulating layer 132d on the source electrode 121 side and the vicinity thereof. As illustrated enlarged in FIG. 4E, distance D between the end portion of mask portion 151 on the source electrode 121 side and the end portion of first sidewall 133d on the drain electrode 122 side is maintained at a distance greater than 0.

On the other hand, the end portion of mask portion 152 of resist pattern 150 is located closer to drain electrode 122 than the end portion of second sidewall 133s on the source electrode 121 side is. In other words, mask portion 152 is positioned to completely cover second insulating layer 132s and partially cover second sidewall 133s. It should be noted that the end portion of mask portion 152 on the drain electrode 122 side may match the end portion of second sidewall 133s on the source electrode 121 side in a plan view. In addition, the end portion of mask portion 152 may be positioned to be above barrier layer 104.

Next, as illustrated in FIG. 4F, a portion of second insulating layer 132d (specifically, a portion in proximity to the end portion on the first sidewall 133d side) is removed. More specifically, a portion of second insulating layer 132d exposed from mask portion 151 on drain electrode 122 side is selectively removed using a wet etching method, and then resist pattern 150 is removed. For example, Buffered Hydro-Fluoric acid (BHF) at room temperature is used to selectively remove a portion of second insulating layer 132d. It should be noted that any mixing ratio of BHF may be used, or Diluted Hydrofluoric acid (DHF) may be used to selectively remove a portion of second insulating layer 132d. The wet etching proceeds isotropically through the gap between first sidewall 133d and mask portion 151. For this reason, as illustrated in FIG. 4F, the end portion of second insulating layer 132d on the source electrode 121 side becomes an inclined surface that is obliquely inclined.

It should be noted that first insulating layer 131 and third insulating layer 133 are SiN and second insulating layer 132 is $SiO_2$, and second insulating layer 132 is selectively removed by a wet etching method using BHF according to the present embodiment. However, the combination is not limited to this. Any insulating material may be used as long as the combination allows the selective removal of second insulating layer 132. In addition, although the wet etching method is used, the chemical dry etching method may be used with first insulating layer 131 and third insulating layer 133 being $SiO_2$ and second insulating layer 132 being SiN.

Figure 4G:
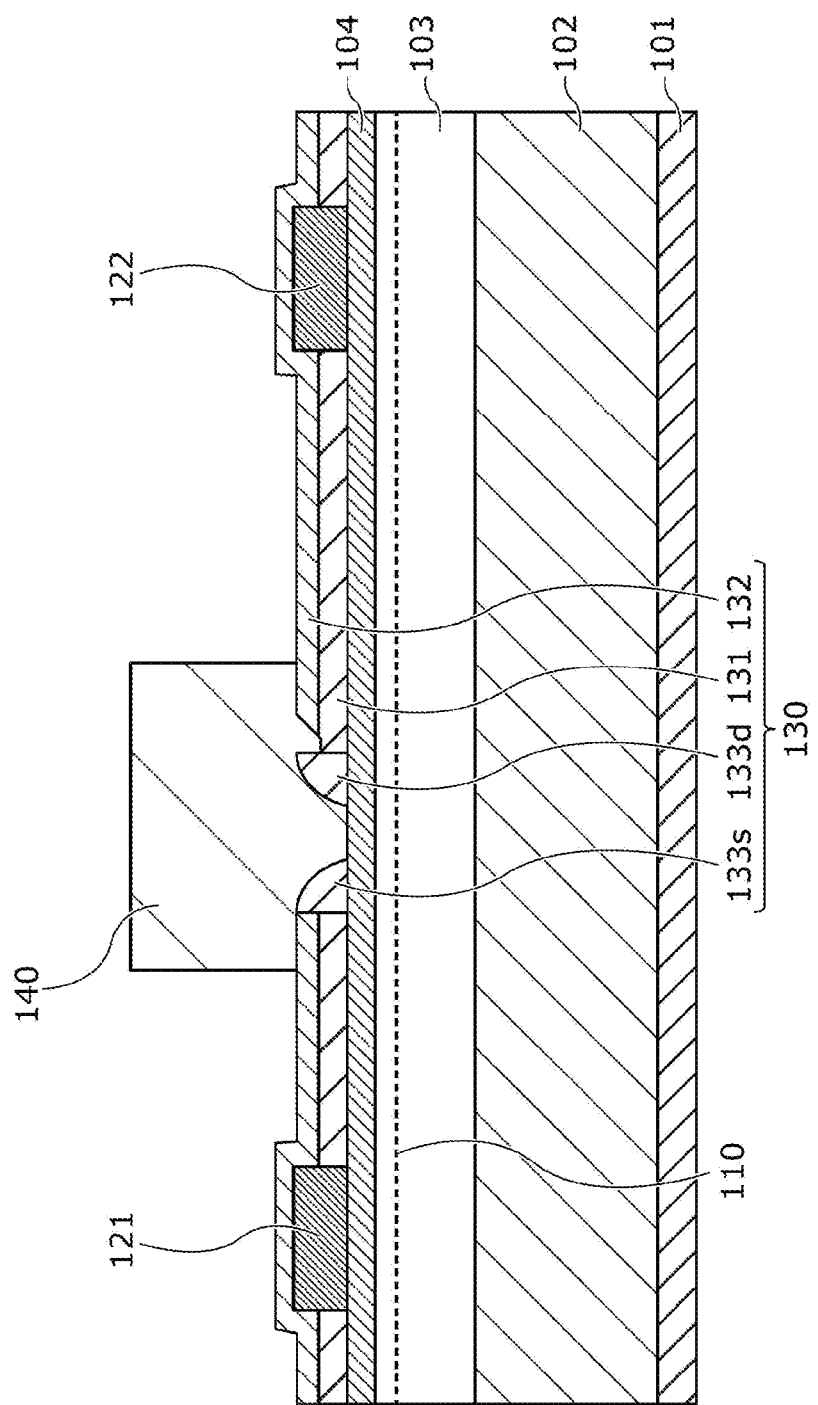
FIG. 4G is a cross-sectional view illustrating a process of the method of manufacturing the semiconductor device according to Embodiment 1.

Next, gate electrode 140 is formed as illustrated in FIG. 4G. More specifically, TiN with a thickness of 50 nm and Al with a thickness of 450 nm are deposited in sequence by a sputtering method. Then, resist is applied to the region where gate electrode 140 is to be formed, and a lithography method is used to pattern the resist to form a mask. Next, a dry etching method is used to remove the mask and the polymer after gate electrode 140 is formed.

Next, fourth insulating layer 134 consisting of SiN with a thickness of 150 nm is deposited by a plasma CVD method, and then TiN with a thickness of 50 nm and Al with a thickness of 450 nm are deposited in sequence by a sputtering method. Then, resist is applied to the region where source field plate 123 is to be formed, and then a lithography method is used to pattern the resist to form a mask. Next, a dry etching method is used to remove the mask and the polymer after source field plate 123 is formed.

By going through the series of processes as described above, manufacturing of semiconductor device 100 that has the configuration illustrated in FIG. 1 is completed.

(Variations of Embodiment 1)

Next, the variations of Embodiment 1 will be described.

In the variations described below, the shape of the bottom surface of projecting portion 142d of gate electrode 140 on the drain electrode 122 side is different compared to that of Embodiment 1. The description will focus on the differences from Embodiment 1, and the description of common points will be omitted or simplified.

[Variation 1]

First, Variation 1 will be described with referenced to FIG. 5 and FIG. 6.

FIG. 5 is a cross-sectional view illustrating a configuration of gate electrode 140 of semiconductor device 100A according to Variation 1 of Embodiment 1. FIG. 6 is an enlarged cross-sectional view of gate electrode 140 of semiconductor device 100A according to Variation 1 of Embodiment 1, to illustrate the shape of bottom surface 144a of projecting portion 142d on the drain electrode 122 side.

As illustrated in FIG. 5, bottom surface 144a of second gate field plate 144 includes inclined surface 144c and flat surface 144d. Bottom surface 144a does not include flat surface 144b that is illustrated in FIG. 2. Second insulating layer 132 is provided below the lowest position (position P3 illustrated in FIG. 6) of bottom surface 144a of second gate field plate 144. In the present variation, first sidewall 133d is arranged to be in contact with the side face of each of first insulating layer 131d and second insulating layer 132d on the junction portion 141 side.

Figure 6:
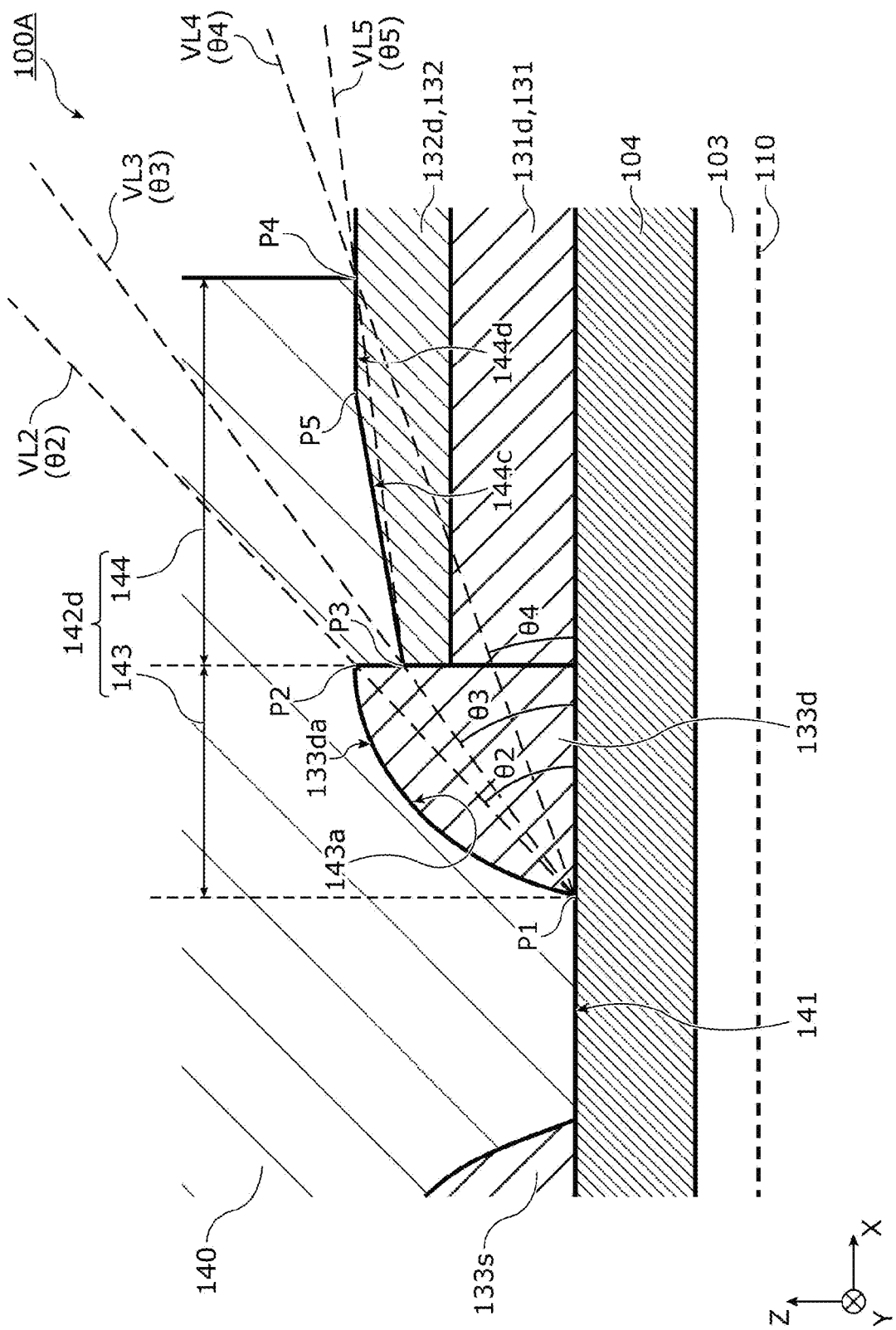
FIG. 6 is an enlarged cross-sectional view illustrating a shape of a bottom surface of a projecting portion of the gate electrode on the drain electrode side of the semiconductor device according to Variation 1 of Embodiment 1.

As illustrated in FIG. 6, in semiconductor device 100A according to Variation 1, third elevation angle θ3 is larger than fourth elevation angle θ4. With this configuration, it is possible to elongate the distance between the end (position P3) on the drain electrode 122 side of the lowest portion of bottom surface 144a of second gate field plate 144 and two-dimensional electron gas 110, thereby enabling the reduction of the electric field intensity at position P3. In addition, second insulating layer 132 consisting of $SiO_2$ has a lower dielectric constant than that of first insulating layer 131 including SIN, and thus the electric field intensity at position P3 can be reduced and the parasitic capacitance (gate-drain capacitance Cgd) can also be reduced.

As described above, in semiconductor device 100A according to the present variation, in the cross-section illustrated in FIG. 6, third elevation angle θ3 is larger than fourth elevation angle θ4. Fourth elevation angle θ4 is an angle formed between the end (position P4) on the drain electrode 122 side of the highest portion of bottom surface 144a of second gate field plate 144 and the main surface of substrate 101 from the viewpoint of the first position (position P1).

With this configuration, it is possible to increase the distance between the lowest position (position P3) of bottom surface 144a of second gate field plate 144 and two-dimensional electron gas 110, thereby enabling the relaxation of the electric field concentration at position P3 and the reduction of the parasitic capacitance (gate drain capacitance Cgd).

In addition, in semiconductor device 100A according to the present variation, second insulating layer 132d overlaps the lowest position of bottom surface 144a of second gate field plate 144 in a plan view.

With this configuration, since second insulating layer 132d consisting of a silicon oxide film that is low in relative permittivity is provided, it is possible to relax the electric field concentration at position P3 and reduce the parasitic capacitance (gate-drain capacitance Cgd).

It should be noted that, in the present variation, bottom surface 144a of second gate field plate 144 need not necessarily include flat surface 144d. In addition, bottom surface 144a of second gate field plate 144 may include a flat surface that is located closer to first sidewall 133d than position P3 is. For example, bottom surface 144a may include a flat surface extending from position P3 in the X-axis negative direction. This flat surface is located above flat surface 144b illustrated in FIG. 2, and a portion of second insulating layer 132d is provided below this flat surface. As a result, it is possible to achieve both the relaxation of the electric field concentration and the reduction of the parasitic capacitance.

[Variation 2]

Next, Variation 2 will be described with referenced to FIG. 7 and FIG. 8.

Figure 7:
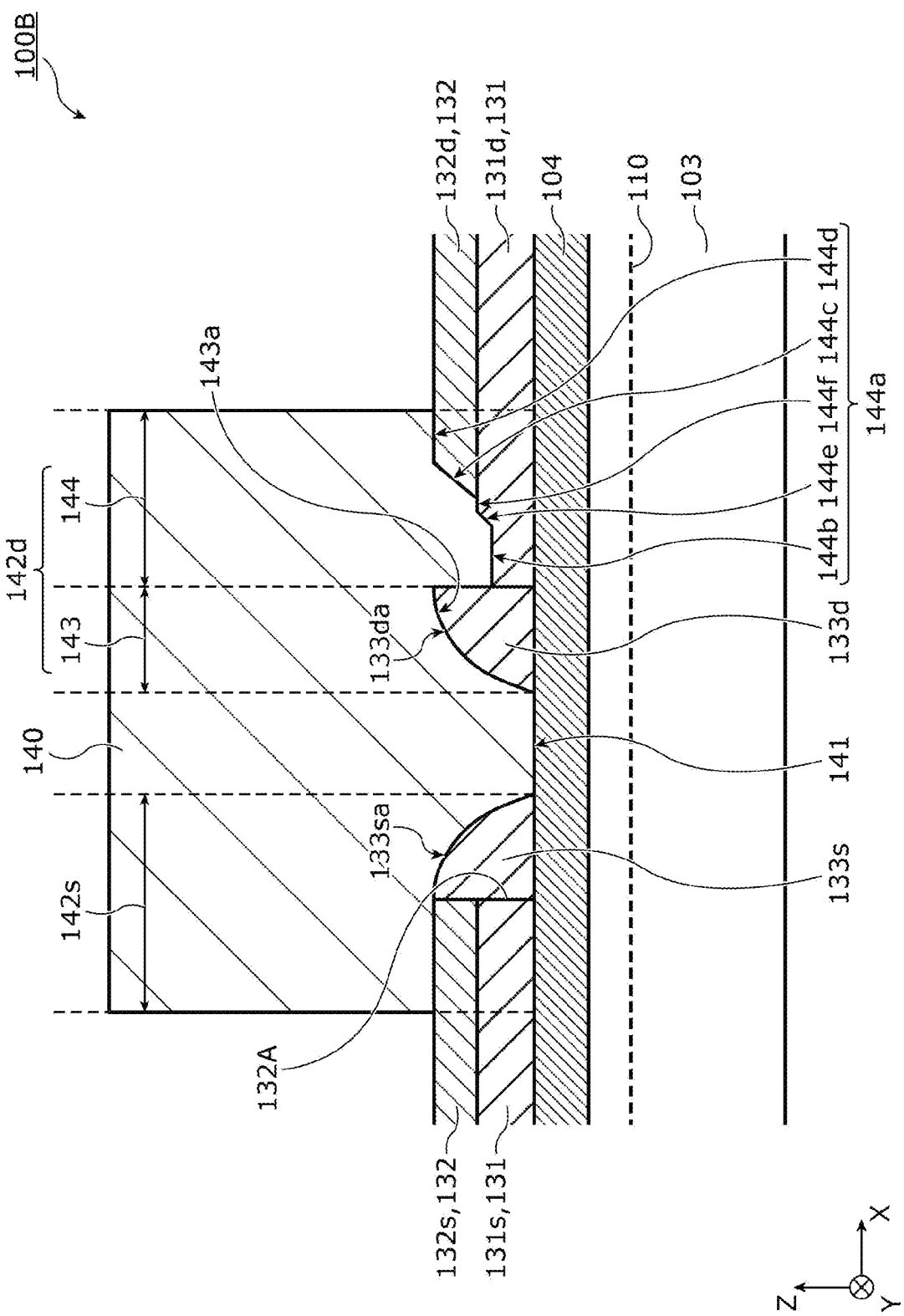
FIG. 7 is a cross-sectional view illustrating a configuration of a gate electrode of a semiconductor device according to Variation 2 of Embodiment 1.

FIG. 7 is a cross-sectional view illustrating a configuration of gate electrode 140 of semiconductor device 100B according to Variation 2 of Embodiment 1. FIG. 8 is an enlarged cross-sectional view of gate electrode 140 of semiconductor device 100B according to Variation 2 of Embodiment 1, to illustrate the shape of bottom surface 144a of projecting portion 142d on the drain electrode 122 side.

As illustrated in FIG. 7, bottom surface 144a of second gate field plate 144 includes three flat surfaces 144b, 144d, and 144f, and two inclined surfaces 144c and 144e. More specifically, flat surface 144b, inclined surface 144e, flat surface 144f, inclined surface 144c, and flat surface 144d are aligned in stated order in the X-axis positive direction. Flat surface 144b is located below flat surface 144f, and flat surface 144f is located below flat surface 144d. In other words, bottom surface 144a is provided in a staircase shape. Flat surface 144b, inclined surface 144e, and flat surface 144f are in contact with first insulating layer 131d. Inclined surface 144c and flat surface 144d are in contact with second insulating layer 132d. The angles of inclination of inclined surfaces 144c and 144e are identical, but they may be different from each other. For example, the angle of inclination of each of inclined surfaces 144c and 144e is in the range of 45 degrees±5 degrees, inclusive.

Figure 8:
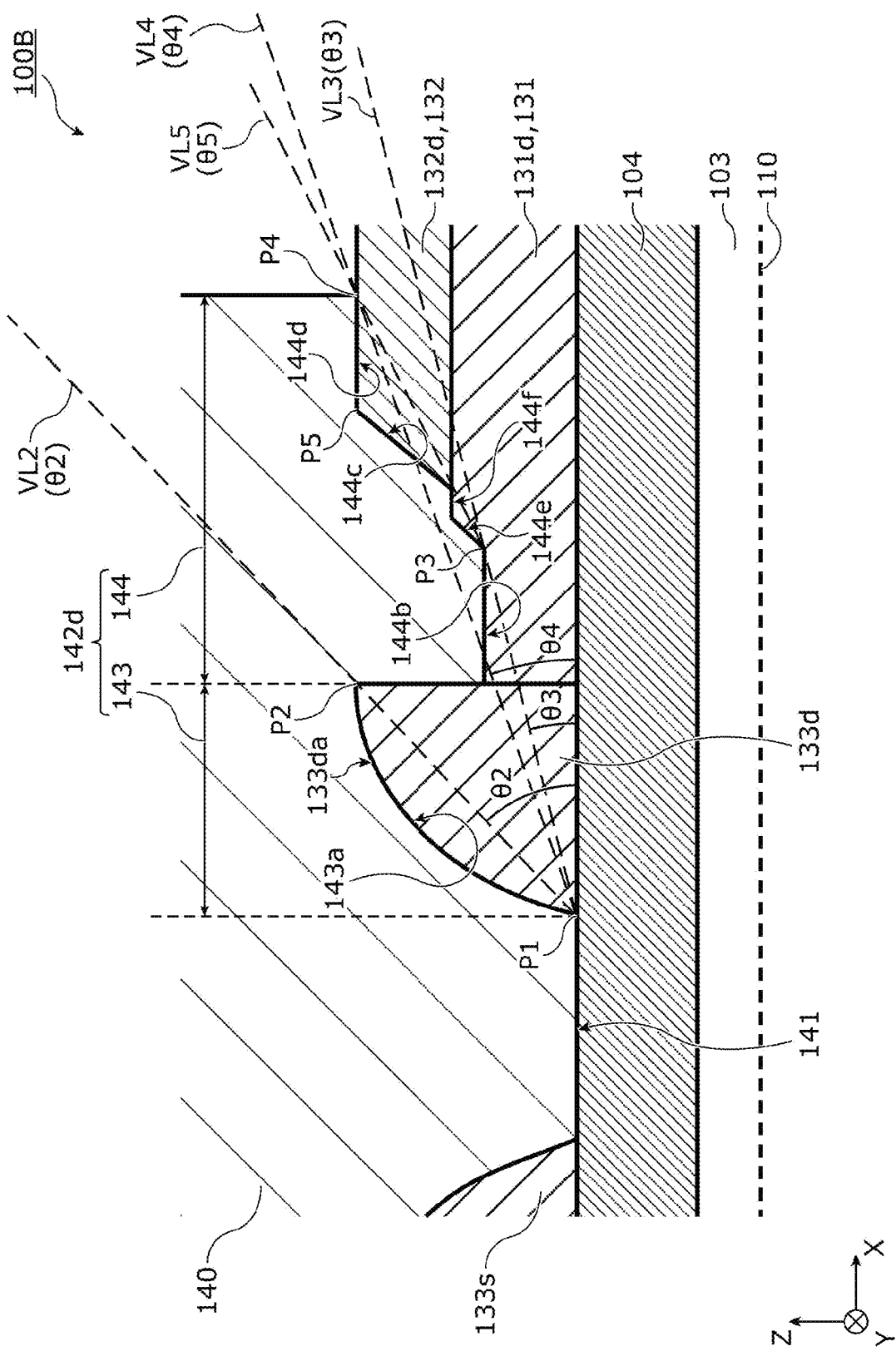
FIG. 8 is an enlarged cross-sectional view illustrating a shape of a bottom surface of a projecting portion of the gate electrode of the semiconductor device on the drain electrode side according to Variation 2 of Embodiment 1.

As illustrated in FIG. 8, in semiconductor device 100B according to Variation 2, third elevation angle θ3 is identical to fourth elevation angle θ4. In other words, the end (position P3) on the drain electrode 122 side of the lowest portion of bottom surfaced 144a of second gate field plate 144 is located below virtual line VL4. With this configuration, it is possible to reduce the distance between position P3 and two-dimensional electron gas 110, thereby enabling the reduction of the electric field intensity at the end (position P1) on the drain electrode 122 side where gate electrode 140 and barrier layer 104 are in contact with each other.

In addition, first insulating layer 131d consisting of SiN has a higher dielectric constant than that of second insulating layer 132d including $SiO_2$. For this reason, it is possible to further reduce the electric field intensity at the end (position P1) on the drain electrode 122 side where gate electrode 140 and barrier layer 104 are in contact with each other. As a result, the depletion layer can easily expand to the drain electrode 122 side below gate electrode 140, and thus it is possible to inhibit the short channel effect.

As described above, in semiconductor device 100B according to the present variation, in the cross-section illustrated in FIG. 8, fourth elevation angle θ4 is larger than third elevation angle θ3. Fourth elevation angle θ4 is an angle formed between the end (position P4) on the drain electrode 122 side of the highest portion of bottom surface 144a of second gate field plate 144 and the main surface of substrate 101 from the viewpoint of the first position (position P1).

With this configuration, the distance between the lowest position (position P3) of bottom surface 144a of second gate field plate 144 and two-dimensional electron gas 110 is reduced. As a result, it is possible to relax the electric field concentration to the end (position P1) on the drain electrode 122 side of junction portion 141.

In addition, in semiconductor device 100B according to the present variation, bottom surface 144a of second gate field plate 144 is in contact with first insulating layer 131d.

With this configuration, the distance between the lowest position (position P3) of bottom surface 144a of second gate field plate 144 and two-dimensional electron gas 110 is reduced. As a result, it is possible to relax the electric field concentration to the end (position P1) on the drain electrode 122 side of junction portion 141. In addition, the depletion layer can easily expand to the drain electrode 122 side below gate electrode 140, and thus it is possible to inhibit the short channel effect.

[Variation 3]

Next, Variation 3 will be described with referenced to FIG. 9.

Figure 9:
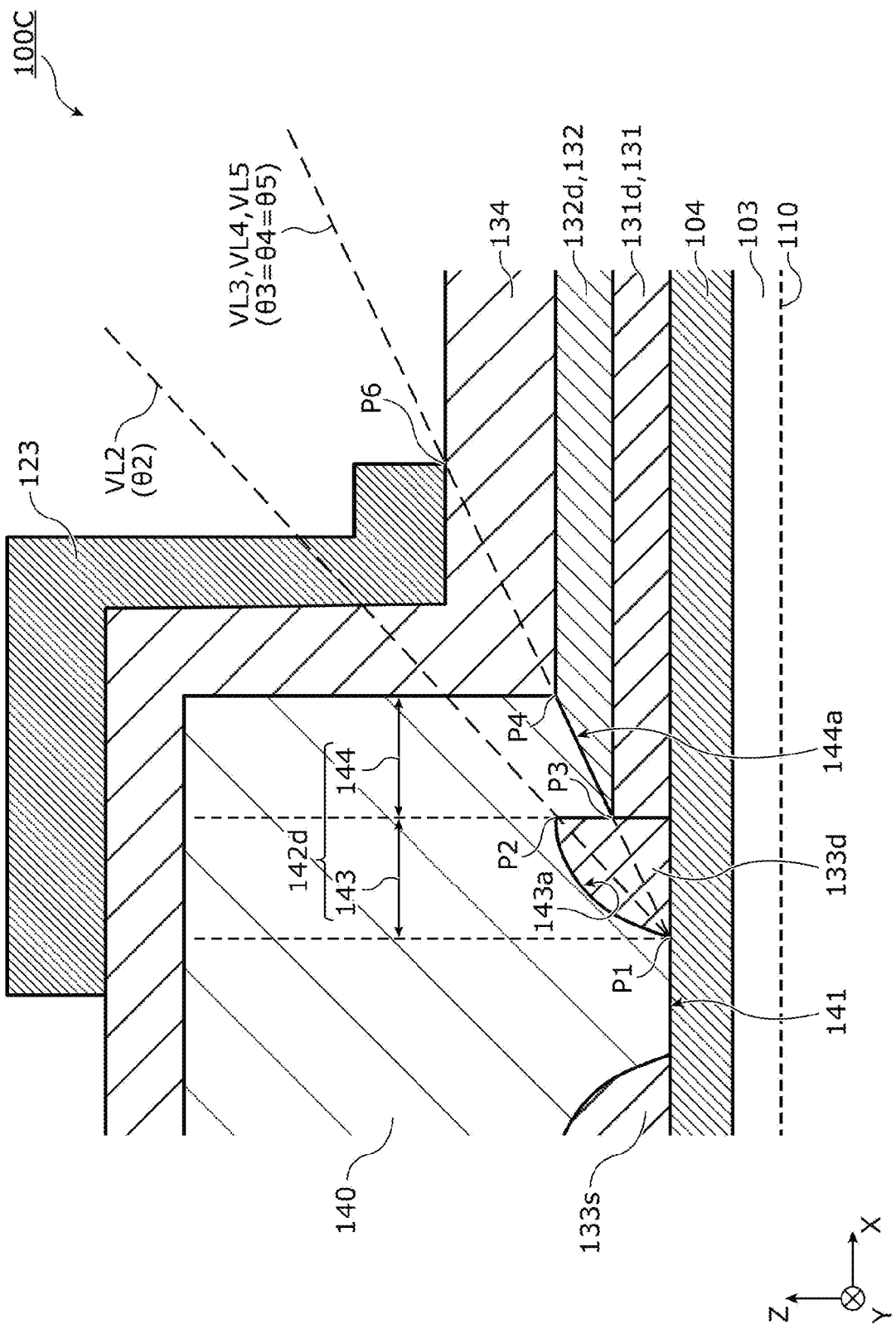
FIG. 9 is an enlarged cross-sectional view illustrating a positional relationship between a shape of a bottom surface of a gate electrode and a source field plate, of a semiconductor device according to Variation 3 of Embodiment 1.

FIG. 9 is an enlarged cross-sectional view to illustrate the positional relationship between the shape of the bottom surface of gate electrode 140 and source field plate 123 of semiconductor device 100C according to Variation 3 of Embodiment 1.

As illustrated in FIG. 9, in semiconductor device 100C according to Variation 3, third elevation angle θ3 is identical to fourth elevation angle θ4. As a result, third elevation angle θ3 is identical to fifth elevation angle θ5. In other word, virtual line VL3 matches each of virtual lines VL4 and VL5. As a result, bottom surface 144a of second gate field plate 144 is an inclined surface where a distance from barrier layer 104 monotonically increases from position P3 toward position P4.

With this configuration, the local concentration of the electric field on gate electrode 140 is eliminated, and thus it is possible to uniform the electric field. As a result, it is possible to reduce the electric field intensity by reducing third elevation angle θ3.

At this time, fifth elevation angle θ5 may be in the range of 45 degrees±5 degrees, inclusive. In the present variation, fifth elevation angle θ5 matches the angle of inclination of bottom surface 144a that is an inclined surface. As described above, the shape of bottom surface 144a of second gate field plate 144 is formed by the partial etching of second insulating layer 132d. In this case, an isotropic etching method can be used, and thus it is possible to easily form the shape of bottom surface 144a.

In addition, in FIG. 9, source field plate 123 does not protrude below virtual line VL4. Specifically, the surface of source field plate 123 is in contact with virtual line VL4. More specifically, the end (position P6) on the drain electrode 122 side of the bottom surface of source field plate 123 is in contact with virtual line VL4.

With this configuration, it is possible to reduce the electric field intensity at the end (position P6) on the drain electrode 122 side of source field plate 123. In addition, it is possible to uniform the electric field applied to each of the end (position P6) on the drain electrode 122 side of source field plate 123 and the ends (positions P1, P3, and P4) on the drain electrode 122 side of gate electrode 140.

As described above, in semiconductor device 100C according to the present variation, in the cross-section illustrated in FIG. 9, third elevation angle θ3 is identical to fourth elevation angle θ4. Fourth elevation angle θ4 is an angle formed between the end (position P4) on the drain electrode 122 side of the highest portion of bottom surface 144a of second gate field plate 144 and the main surface of substrate 101 from the viewpoint of the first position (position P1).

With this configuration, it is possible to uniform the electric field applied to gate electrode 140, thereby enabling the enhancement of relaxation effect on the electric field concentration.

In addition, semiconductor device 100C according to the present variation includes source field plate 123 disposed above gate electrode 140 and set at an electric potential identical to an electric potential of source electrode 121. In the cross section illustrated in FIG. 9, source field plate 123 does not protrude below virtual line VL4 connecting between the first position (position P1) and the end (position P4) on the drain electrode 122 side of the highest portion of bottom surface 144a of second gate field plate 144.

With this configuration, it is possible to relax, by source field plate 123, the electric field concentration on gate electrode 140. In addition, since source field plate 123 does not protrude below virtual line VL4, it is possible to relax the electric field concentration that is concentrated locally to source field plate 123. As a result, it is possible to reduce the parasitic capacitance (source-drain capacitance Cds).

In addition, in semiconductor device 100C according to the present variation, in the cross section illustrated in FIG. 9, the surface of source field plate 123 is in contact with virtual line VL4.

With this configuration, it is possible to uniform the electric field applied to gate electrode 140 and source field plate 123, thereby enabling the increase of relaxation effect on the electric field concentration.

Embodiment 2

Next, a semiconductor device according to Embodiment 2 will be described.

Embodiment 2 is different from Embodiment 1 in that the sidewall on the drain electrode side and the sidewall on the source electrode side differ in height. The description below will focus on the differences from Embodiment 1, and the description of common points will be omitted or simplified.

Figure 10:
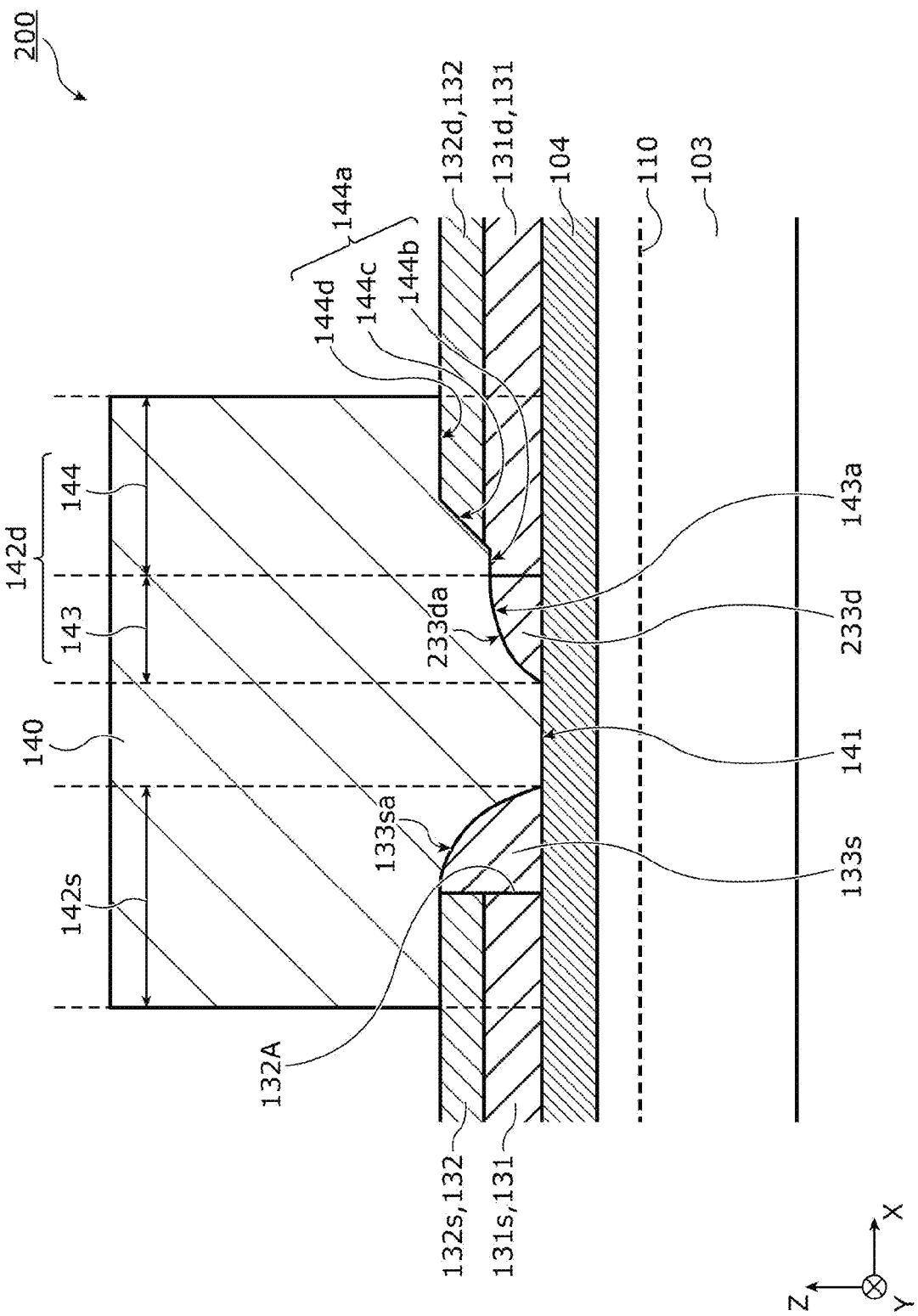
FIG. 10 is a cross-sectional view illustrating a configuration of a gate electrode of a semiconductor device according to Embodiment 2.
Figure 11:
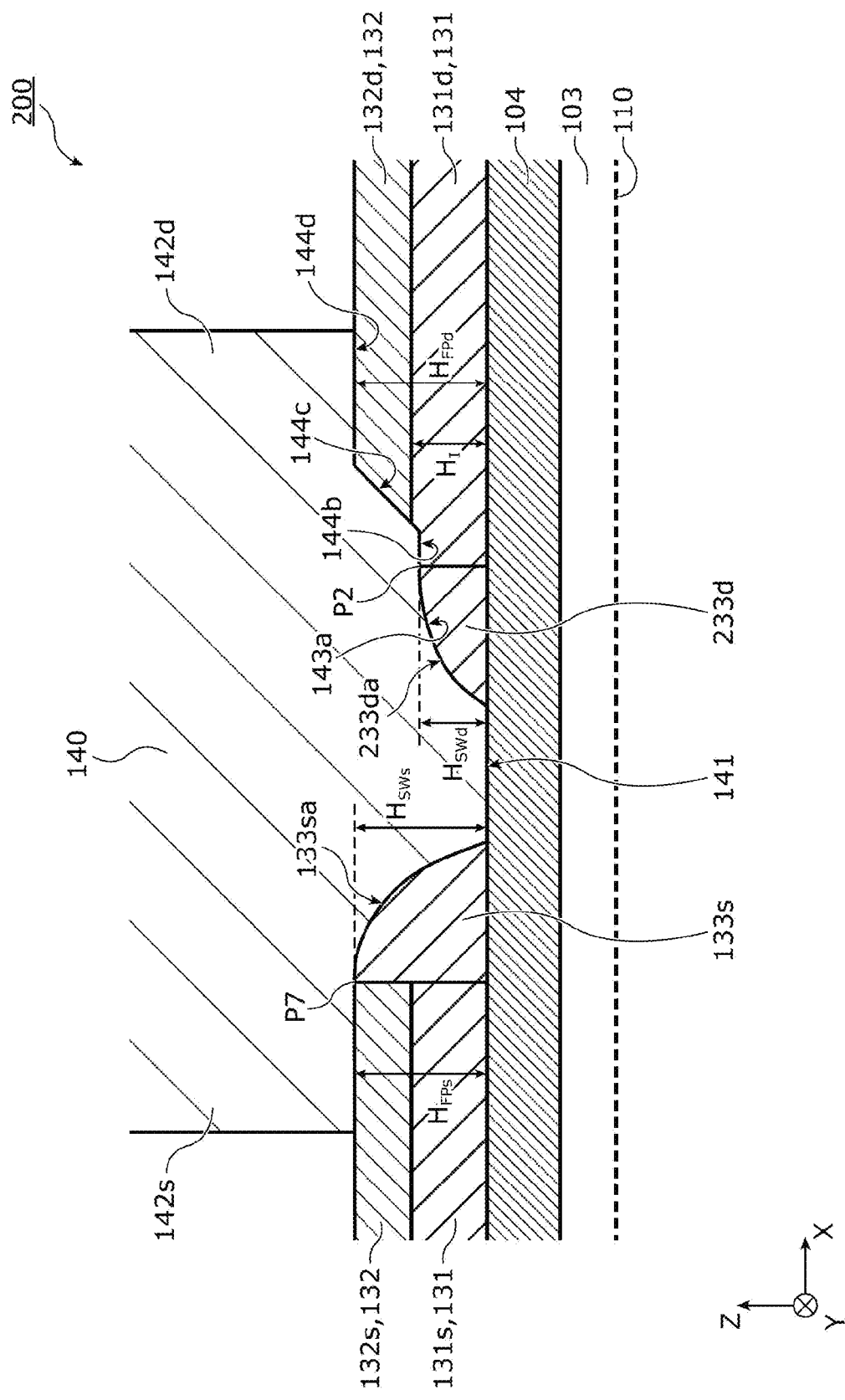
FIG. 11 is an enlarged cross-sectional view illustrating a shape of sidewalls of the semiconductor device according to Embodiment 2.

FIG. 10 is an enlarged cross-sectional view illustrating a configuration of gate electrode 140 of semiconductor device 200 according to Embodiment 2. FIG. 11 is an enlarged cross-sectional view illustrating shapes of the sidewalls of semiconductor device 200 according to Embodiment 2.

As illustrated in FIG. 10 and FIG. 11, semiconductor device 200 according to the present embodiment differs from semiconductor device 100 according to Embodiment 1 in that first sidewall 233d is included in place of first sidewall 133d on the drain electrode 122 side.

As illustrated in FIG. 10 and FIG. 11, the highest position of top surface 233da of first sidewall 233d is located below the highest position of top surface 133sa of second sidewall 133s. To put it simply, first sidewall 233d is lower in height than second sidewall 133s (i.e., shorter in the Z-axis direction). It should be noted that first sidewall 233d may be smaller in width than second sidewall 133s.

In FIG. 11, the highest position of top surface 233da of first sidewall 233d is indicated as position P2. The height of first sidewall 233d is a distance between the top surface of barrier layer 104 and position P2, and denoted by $H_{SWd}$. The highest position of top surface 133sa of second sidewall 133s is indicated as position P7. The height of second sidewall 133s is a distance between the top surface of barrier layer 104 and position P7, and denoted by $H_{SWs}$. According to the present embodiment, the relationship $H_{SWd}<H_{SWs}$ is satisfied. It should be noted that, in the present embodiment, the term "height" means the distance from the top surface of barrier layer 104 in the Z-axis direction, unless otherwise specified.

In addition, in FIG. 11, the thickness of insulating layer 130 on the drain electrode 122 side; that is, the thickness of the stacked structure of first insulating layer 131d and second insulating layer 132d is denoted by $H_{FPd}$. Thickness $H_{FPd}$ corresponds to the height of the highest position of the bottom surface of projecting portion 142d of gate electrode 140 on the drain electrode 122 side. In addition, the thickness of first insulating layer 131d is denoted by $H_I$.

In addition, the thickness of insulating layer 130 on the on the source electrode 121 side; that is, the thickness of the stacked structure of first insulating layer 131s and second insulating layer 132s is denoted by $H_{FPs}$. Thickness $H_{FPs}$ corresponds to the height of the highest position of the bottom surface of projecting portion 142s of gate electrode 140 on the source electrode 121 side.

In this case, $H_{SWs}=H_{FPd}=H_{FPs}$ is satisfied. With this configuration, it is possible to enhance the electron density of two-dimensional electron gas 110 in the direction directly below projecting portion 142d and projecting portion 142s in each of the source electrode 121 side and the drain electrode 122 side. As a result, it is possible to reduce the on-resistance.

In addition, $H_{SWd}<H_I$ is satisfied. In other words, highest position P2 of first sidewall 233d is located below the interface between first insulating layer 131d and second insulating layer 132d. More specifically, highest position P2 of first sidewall 233d is at the same height as the top surface of first insulating layer 131d (i.e., the portion of projecting portion 142d in contact with flat surface 144b). For this reason, the portion from top surface 233da of first sidewall 233d to the top surface of first insulating layer 131d is smoothly continuous. With this configuration, the bottom surface of projecting portion 142d of gate electrode 140 defines a smooth continuation of bottom surface 143a of first gate field plate 143 and bottom surface 144a (specifically, inclined surface 144c) of second gate field plate 144. The reduced unevenness enables the improvement of coverage of gate electrode 140, thereby enabling the enhancement of device reliability.

In addition, in the present embodiment, bottom surface 144a of second gate field plate 144 includes inclined surface 144c where the distance from barrier layer 104 monotonically increases in the X-axis positive direction, in the same manner as Embodiment 1. With this configuration, it is possible to disperse the electric field concentration and reduce the electric field intensity as with Embodiment 1.

As described above, semiconductor device 200 according to the present embodiment includes: substrate 101; channel layer 103 disposed above substrate 101 and consisting of a group III nitride semiconductor; barrier layer 104 disposed above channel layer 103 and including a group III nitride semiconductor with a bandgap larger than a bandgap of channel layer 103; source electrode 121 and drain electrode 122 disposed above barrier layer 104 and spaced apart from each other in the X-axis direction on the main surface of substrate 101; gate electrode 140 disposed between source electrode 121 and drain electrode 122 and spaced apart from each of source electrode 121 and drain electrode 122 in the X-axis direction; and insulating layer 130 disposed above barrier layer 104 and disposed between gate electrode 140 and source electrode 121 and between gate electrode 140 and drain electrode 122. Insulating layer 130 includes first insulating layer 131 as a bottom layer and second insulating layer 132 located above first insulating layer 131. First insulating layer 131 consists of silicon nitride, and second insulating layer 132 including silicon oxide. Gate electrode 140 includes: junction portion 141 that forms a Schottky junction with barrier layer 104; projecting portion 142s; and projecting portion 142d. Projecting portion 142s projects toward source electrode 121 from junction portion 141 in the X-axis direction, and projecting portion 142d projects toward drain electrode 122 from junction portion 141 in the X-axis direction. Insulating layer 130 includes: first sidewall 233d located at one end (the end portion on the junction portion 141 side) on a junction portion 141 side of insulating layer 130 between junction portion 141 and drain electrode 122, between projecting portion 142d and barrier layer 104 in the Z-axis direction perpendicular to the main surface of substrate 101; and second sidewall 133s located at another end (the end portion on the junction portion 141 side) on the junction portion 141 side of insulating layer 130, between junction portion 141 and source electrode 121. Projecting portion 142d includes first gate field plate 143 extending in a section from a first position to a second position in the plan view; and second gate field plate 144 extending in a section from the second position to a third position in the plan view. The first position is at an end on the junction portion 141 side of first sidewall 233d, the second position is at an end on the drain electrode 122 side of first sidewall 233d, and the third position is at an end on the drain electrode 122 side of projecting portion 142d. First insulating layer 131d and second insulating layer 132d are stacked between second gate field plate 144 and barrier layer 104. In a cross-section (XZ cross-section) parallel to each of the X-axis direction and the Z-axis direction, and passing though junction portion 141: tangent line (virtual line VL1) at the first position (position P1) of top surface 133da of first sidewall 133d is inclined at first elevation angle θ1 relative to the main surface; an angle formed between a highest position (position P2) of bottom surface 143a of first gate field plate 143 and the main surface of substrate 101 from a viewpoint of the first position is second elevation angle θ2; and an angle formed between an end (position P3) on the drain electrode 122 side of a lowest portion of bottom surface 144a of second gate field plate 144 and the main surface of substrate 101 from a viewpoint of the first position is third elevation angle θ3. The highest position (position P2) of top surface 233da of first sidewall 233d is located below the highest position (position P7) of top surface 133da of second sidewall 133s.

With this configuration, since two-dimensional electron gas 110 is generated in channel layer 103 in proximity to the interface with barrier layer 104, it is possible to implement a transistor using, as a channel, two-dimensional electron gas 110 generated. In addition, since gate electrode 140 includes junction portion 141 and projecting portion 142d, it is possible to easily implement the miniaturization of gate length (Lg) and the electric field relaxation by projecting portion 142d.

In addition, since the height of first sidewall 233d is low in semiconductor device 200, the distance between first gate field plate 143 and two-dimensional electron gas 110 is reduced. For this reason, it is possible to facilitate expansion of the depletion layer in channel layer 103 when the transistor is off, thereby enabling inhibiting of the short channel effect. As a result, it is possible to inhibit the off leakage current between source electrode 121 and drain electrode 122, thereby enabling improvement of the off characteristic of semiconductor device 200.

In addition, since the height of second sidewall 133s is high, the electron density of two-dimensional electron gas 110 below second sidewall 133s increases. For this reason, it is possible to lower the parasitic resistance between gate electrode 140 and source electrode 121, thereby enabling lowering of the on-resistance.

As described above, with semiconductor device 200 according to the present embodiment, it is possible to implement both the lowering of the on-resistance and the improvement of the off characteristic.

In addition, in semiconductor device 200 according to the present embodiment, bottom surface 144a of second gate field plate 144 includes inclined surface 144c where a distance from barrier layer 104 monotonically increases in a direction from gate electrode 140 to drain electrode 122.

With this configuration, it is possible to disperse the electric field to the end portion of gate electrode 140 on the drain electrode 122 side and the lowest position (position P3) of bottom surface 144a of second gate field plate 144.

Figure 12:
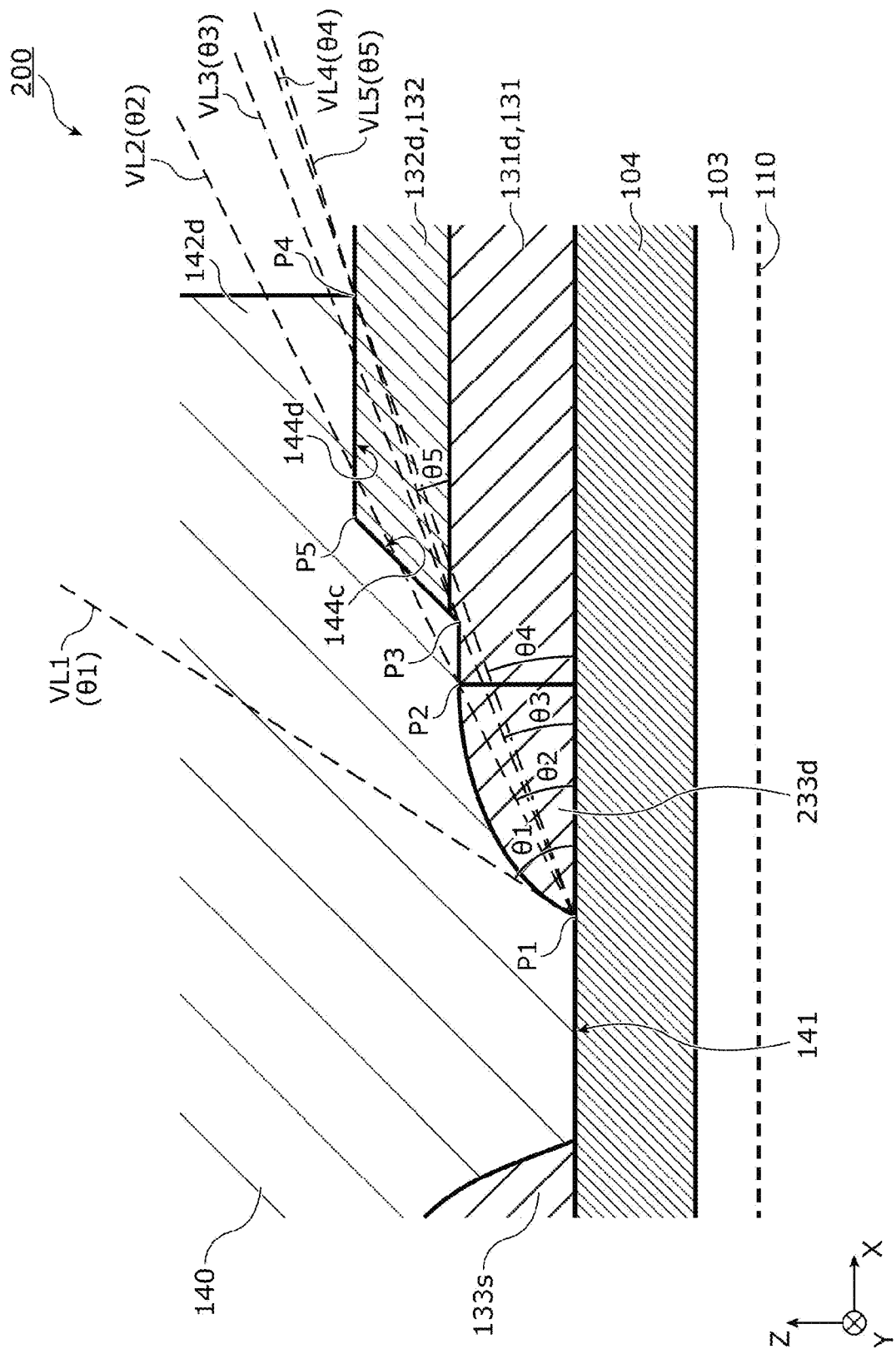
FIG. 12 is an enlarged cross-sectional view illustrating a shape of a bottom surface of a projecting portion of the gate electrode on the drain electrode side of the semiconductor device according to Embodiment 2.

Here, FIG. 12 is an enlarged cross-sectional view for explaining the shape of bottom surface 144a of projecting portion 142d of gate electrode 140 on the drain electrode 122 side, of semiconductor device 200 according to the present embodiment. In the present embodiment as well, first elevation angle θ1 through fifth elevation angle θ5 are defined as illustrated in FIG. 12. First elevation angle θ1 through fifth elevation angle θ5 are same as those in semiconductor device 100 according to Embodiment 1, and defined by virtual lines VL1 to VL5 and positions P1 to P5.

As illustrated in FIG. 12, second elevation angle θ2 is larger than third elevation angle θ3. In addition, second elevation angle θ2 is larger than fifth elevation angle θ5. Third elevation angle θ3 is larger than fourth elevation angle θ4. With these configurations, it is possible to implement the electric field relaxation and the reduction of parasitic capacitance in the same manner as Embodiment 1.

It should be noted that, in the case of the variations described below, there are instances where second elevation angle θ2 is smaller than third elevation angle θ3 (semiconductor device 200B of FIG. 15). In addition, although not illustrated in the diagram, second elevation angle θ2 may be identical to third elevation angle θ3. In addition, third elevation angle θ3 may be smaller than fourth elevation angle θ4. Furthermore, third elevation angle θ3, fourth elevation angle θ4, and fifth elevation angle θ5 may be identical. As described above, in the present embodiment as well, it is possible to apply the variations related to the respective elevation angles described in Embodiment 1 and the variations thereof.

[Manufacturing Method]

The following describes a manufacturing method of semiconductor device 200 according to the present embodiment, with reference to FIG. 13A to FIG. 13E.

FIG. 13A to FIG. 13E are each a cross-sectional view for illustrating each process of the manufacturing method of semiconductor device 200 according to the present embodiment. FIG. 13A to FIG. 13E each illustrate a cross-sectional configuration of semiconductor device 200 in the process of manufacturing. It should be noted that, in each of the diagrams, three lines L1 to L3 extending from the top surface of barrier layer 104 in the Z-axis direction are same as lines L1 to L3 illustrated in FIG. 4A.

First, the processes until second insulating layer 132 is formed are same as those in Embodiment 1. In other words, through the processes explained with reference to FIG. 4A and FIG. 4B, buffer layer 102, channel layer 103, barrier layer 104, first insulating layer 131, source electrode 121, drain electrode 122, and second insulating layer 132 are formed above substrate 101.

Figure 13A:
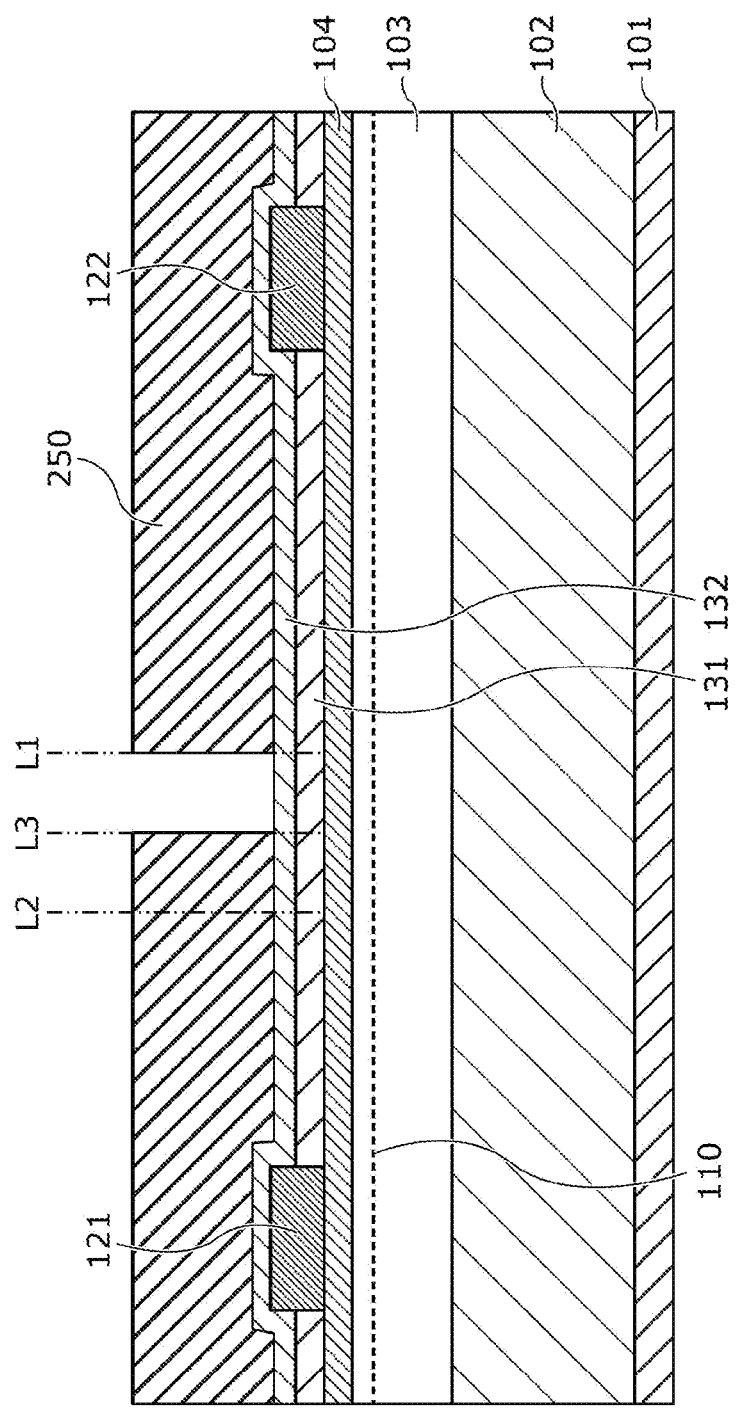
FIG. 13A is a cross-sectional view illustrating a process of a method of manufacturing the semiconductor device according to Embodiment 2.

Next, As illustrated in FIG. 13A, resist pattern 250 is formed with a predetermined region being opened. More specifically, a resist is applied, and then the resist is patterned by a lithographic method to form a mask (resist pattern 250) in a region other than a portion where third opening portion 132B (see FIG. 13B) is formed. The opening provided in resist pattern 250 is formed, for example, by removing the range between line L1 and line L3.

Figure 13B:
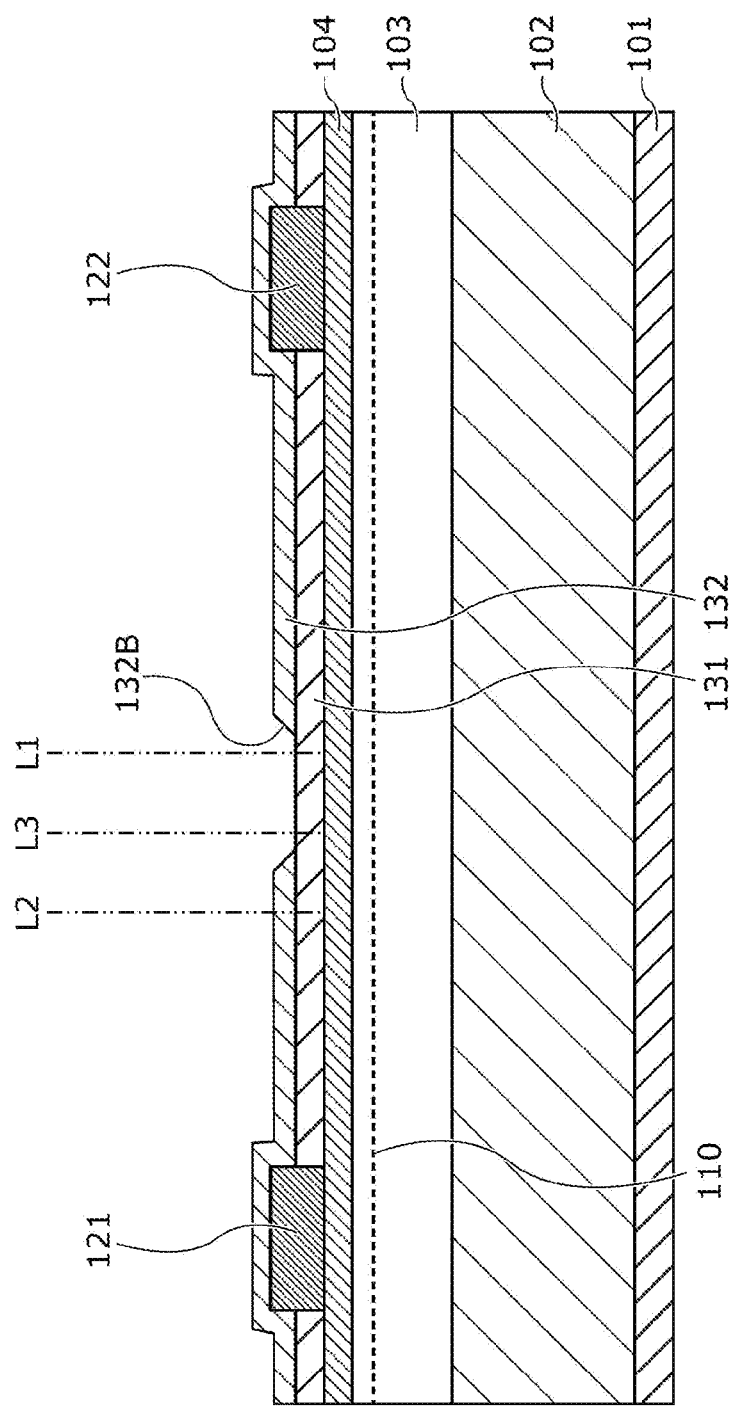
FIG. 13B is a cross-sectional view illustrating a process of the method of manufacturing the semiconductor device according to Embodiment 2.

Next, as illustrated in FIG. 13B, second insulating layer 132 is selectively removed using a wet etching method to form third opening portion 132B, and then the mask (resist pattern 250) is removed. For example, a portion of second insulating layer 132 is selectively removed using BHF at room temperature. It should be noted that any mixing ratio of BHF may be used, or DHF may be used to selectively remove second insulating layer 132.

It should be noted that first insulating layer 131 is SiN and second insulating layer 132 is $SiO_2$, and second insulating layer 132 is selectively removed by the wet etching method using BHF according to the present embodiment. However, the combination is not limited to this. Any combination may be employed as long as the combination allows the selective removal of second insulating layer 132. Although the wet etching method is used, a chemical dry etching method may be used with first insulating layer 131 being $SiO_2$ and second insulating layer 132 being SiN.

Figure 13C:
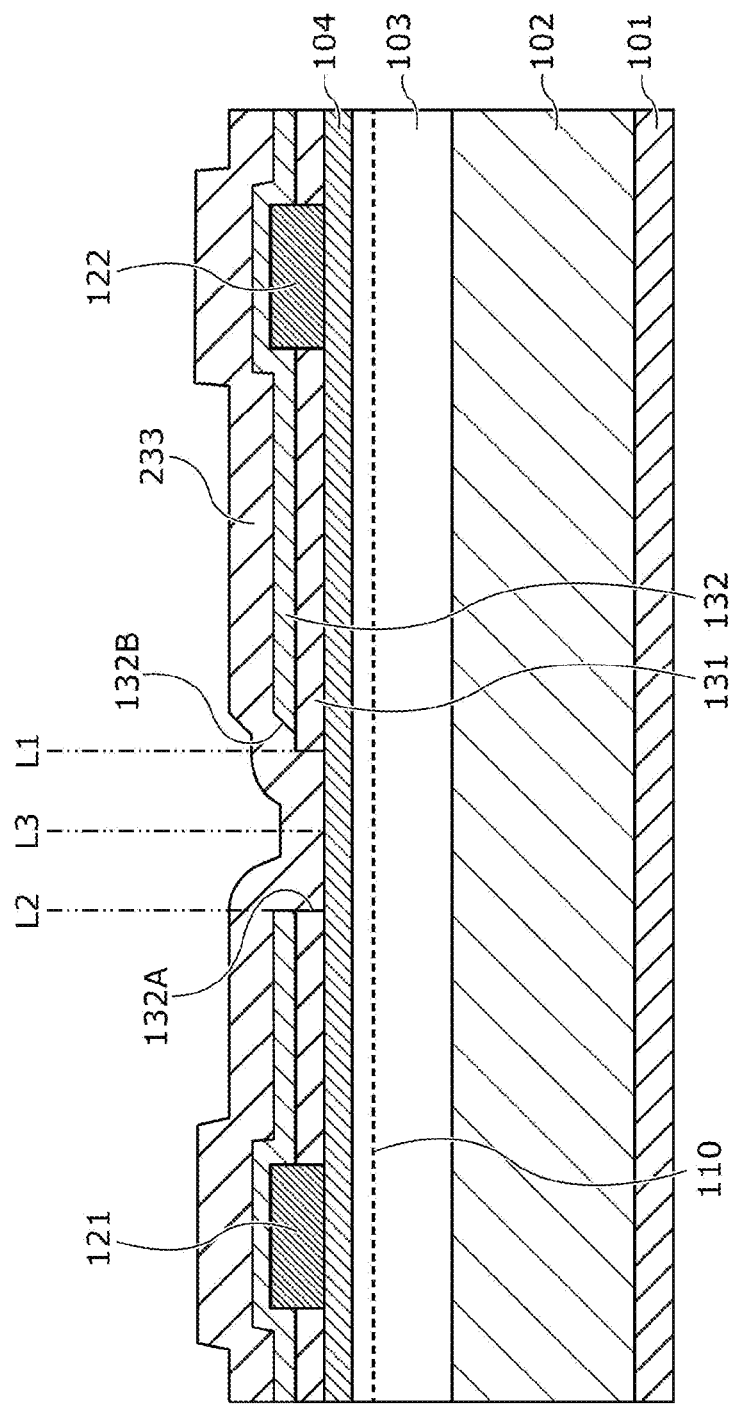
FIG. 13C is a cross-sectional view illustrating a process of the method of manufacturing the semiconductor device according to Embodiment 2.

Next, as illustrated in FIG. 13C, second opening portion 132A and third insulating layer 233 are formed. Specifically, first, a resist is applied, and then the resist is patterned using a lithography method to form a mask. More specifically, in a plan view, the end portion on the drain electrode 122 side of the resist pattern is positioned in third opening portion 132B (specifically, the position that matches line L1). In addition, the end portion on the source electrode 121 side of the resist pattern is positioned to be above second insulating layer 132 and closer to source electrode 121 than third opening portion 132B (specifically, the position that matches line L2).

Next, a dry etching method is used to form second opening portion 132A in first insulating layer 131 and second insulating layer 132 such that barrier layer 104 is exposed. After second opening portion 132A is formed, the mask and a polymer are removed.

Next, third insulating layer 233 consisting of SiN with a thickness of 100 nm is deposited by a plasma CVD method. Third insulating layer 233 is provided to fill in second opening portion 132A.

Figure 13D:
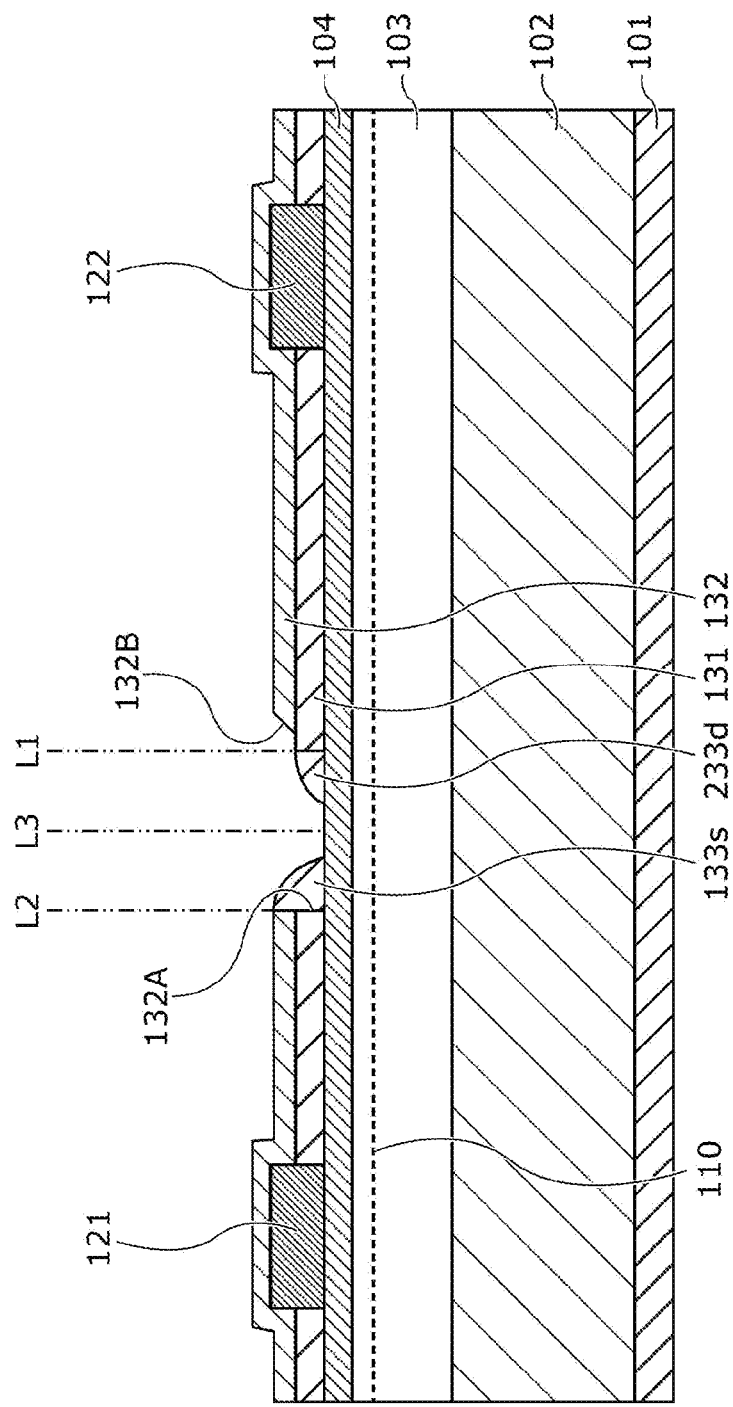
FIG. 13D is a cross-sectional view illustrating a process of the method of manufacturing the semiconductor device according to Embodiment 2.

Next, as illustrated in FIG. 13D, a dry etching method is used to etch back third insulating layer 233. As a result of this, first sidewall 233d and second sidewall 133s are formed such that barrier layer 104 is exposed.

Figure 13E:
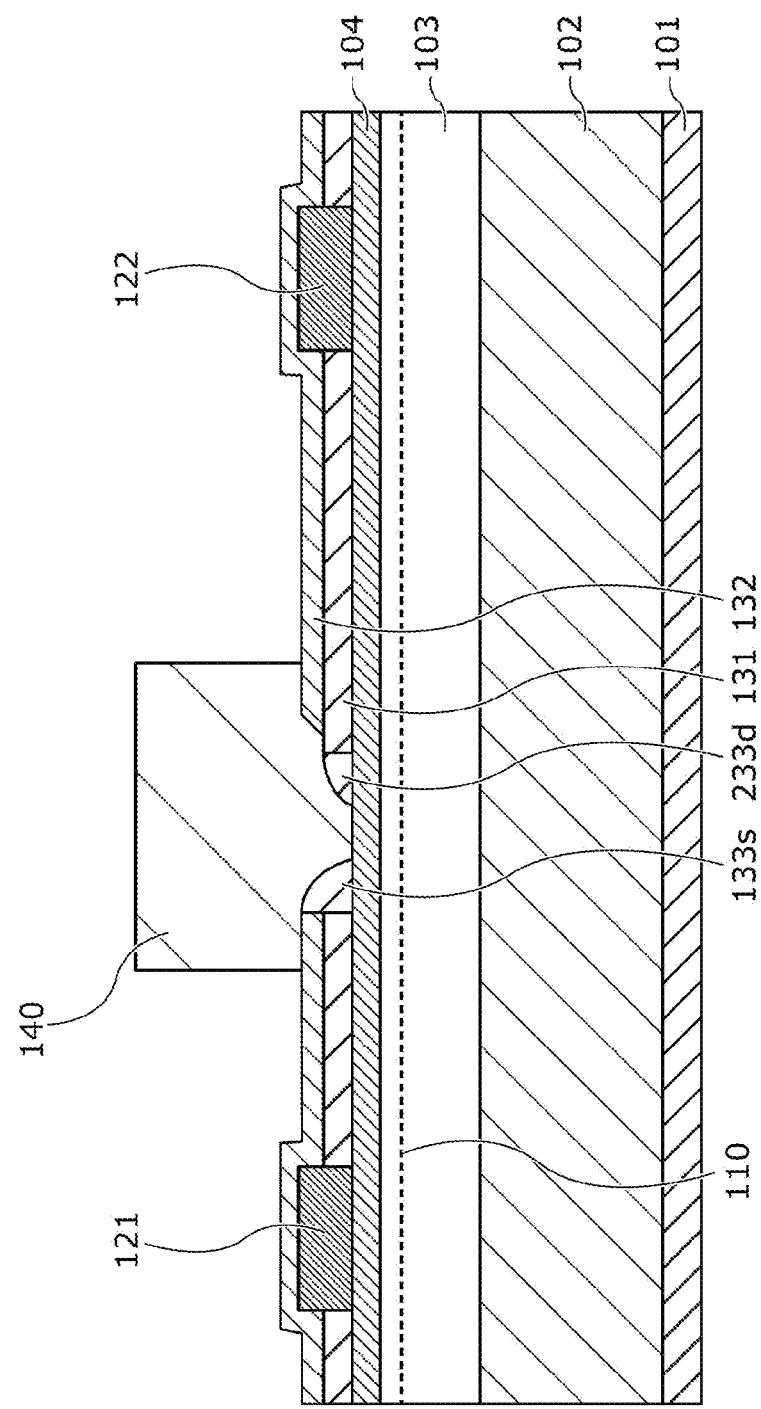
FIG. 13E is a cross-sectional view illustrating a process of the method of manufacturing the semiconductor device according to Embodiment 2.

Next, gate electrode 140 is formed as illustrated in FIG. 13E. More specifically, TiN with a thickness of 50 nm and Al with a thickness of 450 nm are deposited in sequence by a sputtering method. Then, resist is applied to the region where gate electrode 140 is to be formed, and a lithography method is used to pattern the resist to form a mask. Next, a dry etching method is used to remove the mask and the polymer after gate electrode 140 is formed.

The subsequent processes are the same as the processes in Embodiment 1. Specifically, fourth insulating layer 134 and source field plate 123 are formed.

By going through the series of the processes as described above, manufacturing of semiconductor device 200 that has the configuration illustrated in FIG. 10 is completed.

(Variations of Embodiment 2)

Next, the variations of Embodiment 2 will be described.

In the variations described below, the height of first sidewall 233d and/or the shape of the bottom surface of projecting portion 142d of gate electrode 140 are different compared to Embodiment 2. The description below will focus on the differences from Embodiment 2, and the description of common points will be omitted or simplified.

[Variation 1]

First, Variation 1 will be described with referenced to FIG. 14.

Figure 14:
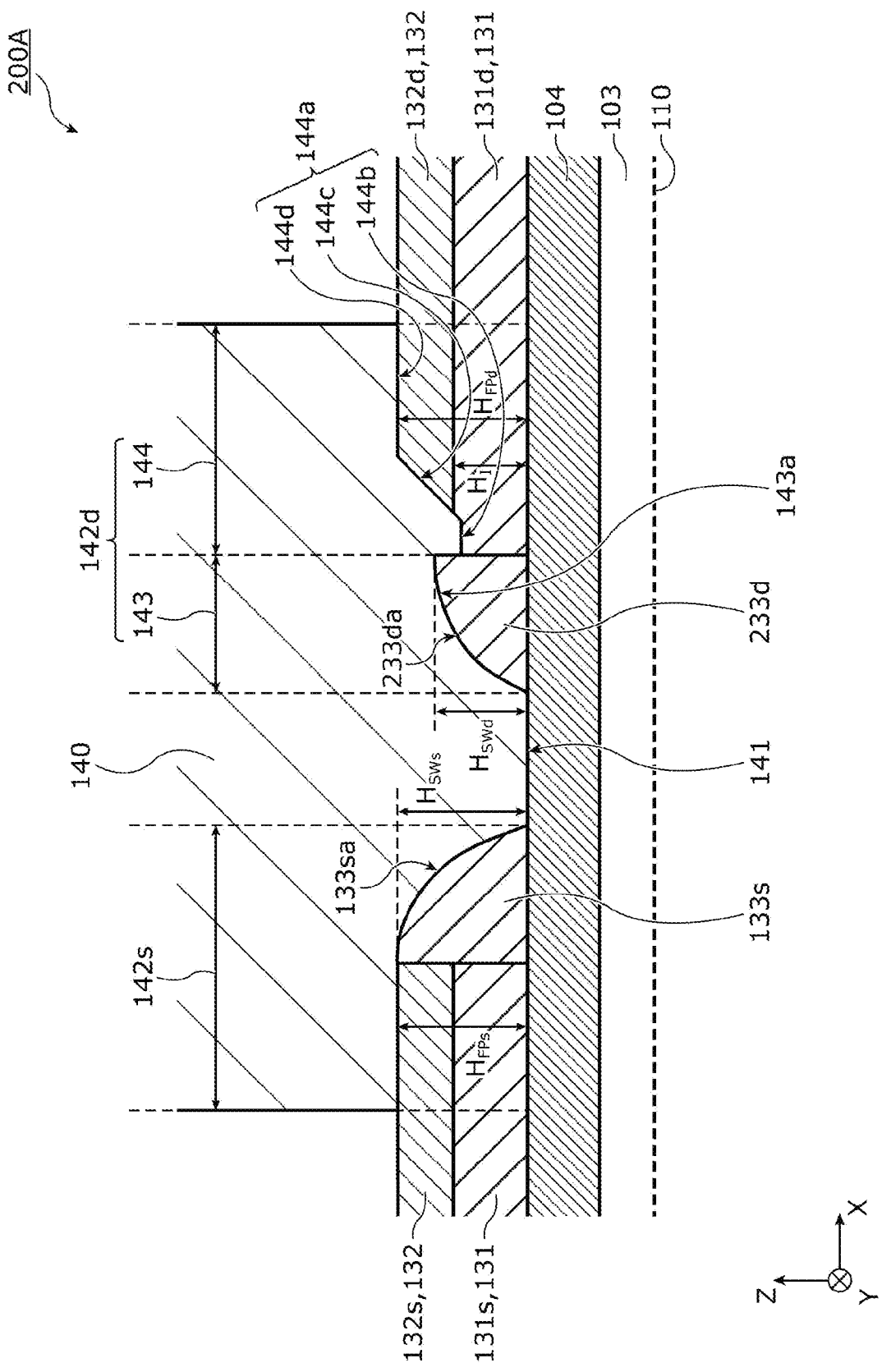
FIG. 14 is an enlarged cross-sectional view illustrating a shape of sidewalls of a semiconductor device according to Variation 1 of Embodiment 2.

FIG. 14 is an enlarged cross-sectional view illustrating the shapes of sidewalls of semiconductor device 200A according to Variation 1 of Embodiment 2. As illustrated in FIG. 14, in the present variation, first sidewall 233d is higher compared to that of Embodiment 2. More specifically, height $H_{SWd}$ of first sidewall 233d is lower than height $H_{SWs}$ of second sidewall 133s and higher than thickness $H_I$ of first insulating layer 131d.

With this configuration, it is possible to easily maintain the distance between two-dimensional electron gas 110 and projecting portion 142d of gate electrode 140 long in the direction directly below first sidewall 233d, thereby enabling the reduction in parasitic capacitance (gate-drain capacitance Cgd).

[Variation 2]

Next, Variation 2 will be described with referenced to FIG. 15.

Figure 15:
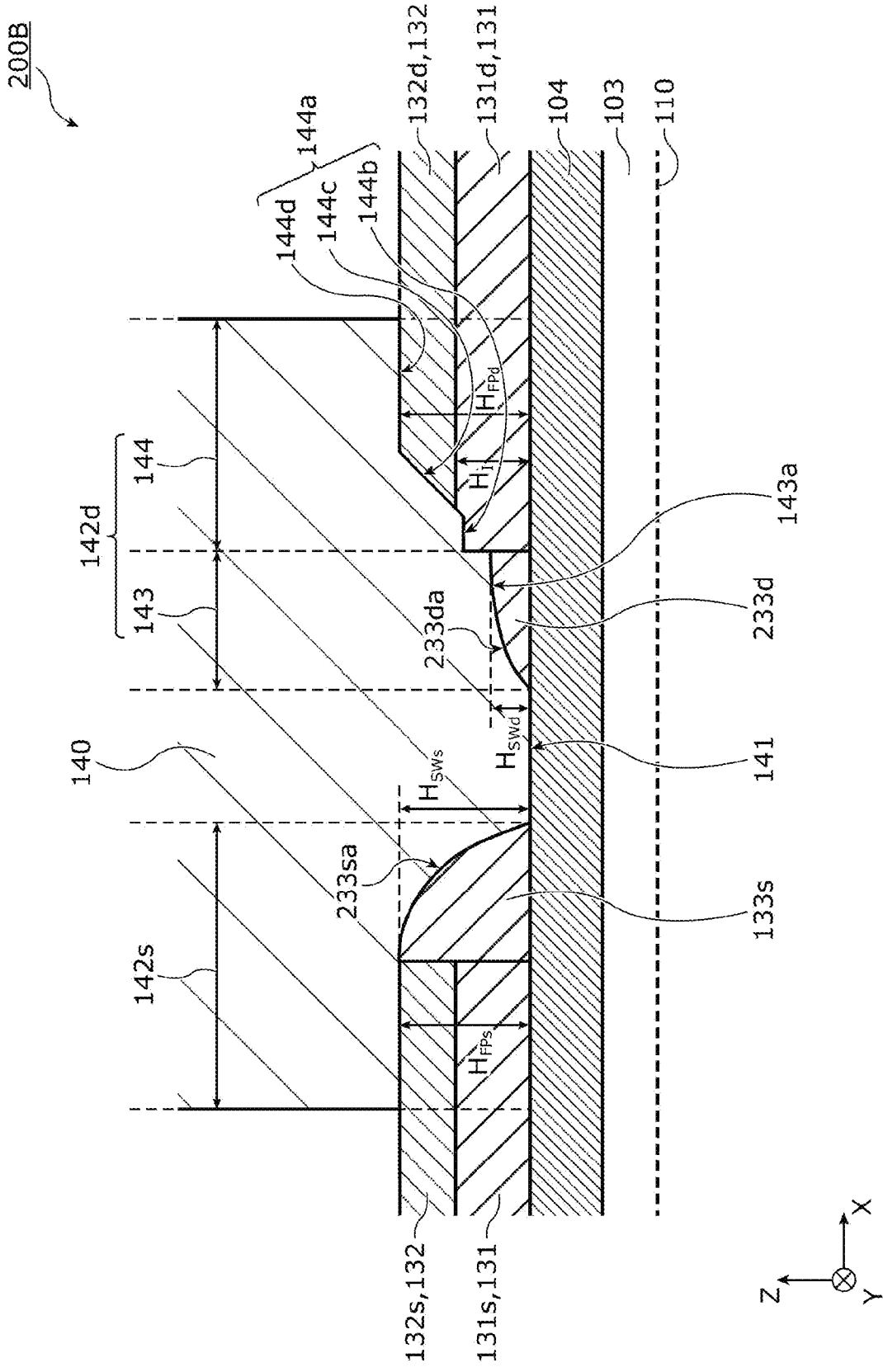
FIG. 15 is an enlarged cross-sectional view illustrating a shape of sidewalls of a semiconductor device according to Variation 2 of Embodiment 2.

FIG. 15 is an enlarged cross-sectional view for explaining the shapes of sidewalls of semiconductor device 200B according to Variation 2 of Embodiment 2. As illustrated in FIG. 15, in the present variation, first sidewall 233d is lower compared to that of Embodiment 2. More specifically, height $H_{SWd}$ of first sidewall 233d is lower than thickness $H_I$ of first insulating layer 131d and lower than the top surface of first insulating layer 131d (the portion in contact with flat surface 144b of projecting portion 142d). For this reason, a difference in level is generated between top surface 233da of first sidewall 233d and the top surface of first insulating layer 131d.

With this configuration, since first sidewall 233d is lower, the depletion layer can more easily expand in the direction directly below first sidewall 233d when the transistor is off, and thus it is possible to inhibit the short channel effect. As a result, it is possible to enhance the off characteristic.

[Variation 3]

Next, Variation 3 will be described with referenced to FIG. 16.

Figure 16:
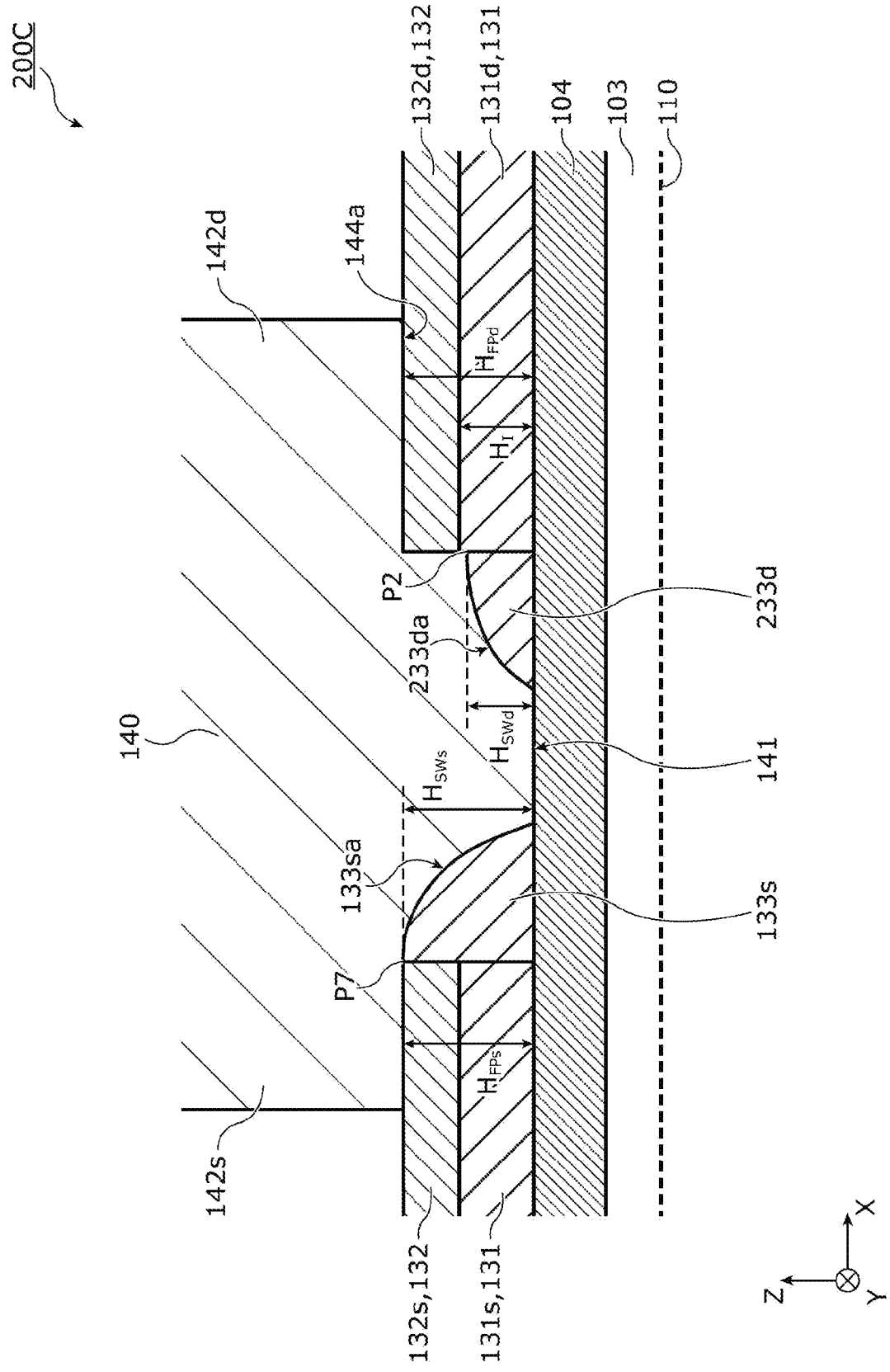
FIG. 16 is an enlarged cross-sectional view illustrating a shape of sidewalls of a semiconductor device according to Variation 3 of Embodiment 2.

FIG. 16 is an enlarged cross-sectional view for explaining the shapes of sidewalls of semiconductor device 200C according to Variation 3 of Embodiment 2. As illustrated in FIG. 16, in the present variation, the shape of the bottom surface of projecting portion 142d of gate electrode 140 is different compared to that of Embodiment 2, while the shape of first sidewall 233d is the same. More specifically, bottom surface 144a of second gate field plate 144 does not include an inclined surface. Bottom surface 144a is a flat surface parallel to the main surface of substrate 101.

Even with this configuration, since first sidewall 233d is low in height, the distance between first gate field plate 143 and two-dimensional electron gas 110 is reduced. For this reason, it is possible to facilitate expansion of the depletion layer in channel layer 103 when the transistor is off, thereby enabling the inhibiting of the short channel effect. As a result, it is possible to inhibit the off leakage current between source electrode 121 and drain electrode 122, thereby enabling the improvement of the off characteristic of semiconductor device 200.

In addition, since second sidewall 133s is high in height, the electron density of two-dimensional electron gas 110 below second sidewall 133s increases. For this reason, it is possible to reduce the parasitic resistance between gate electrode 140 and source electrode 121, thereby enabling the reduction in the on-resistance.

As described above, even with semiconductor device 200C according to the present variation, it is possible to achieve both the reduction in the on-resistance and the improvement of the off characteristics.

[Variation 4]

Next, Variation 4 will be described with referenced to FIG. 17.

Figure 17:
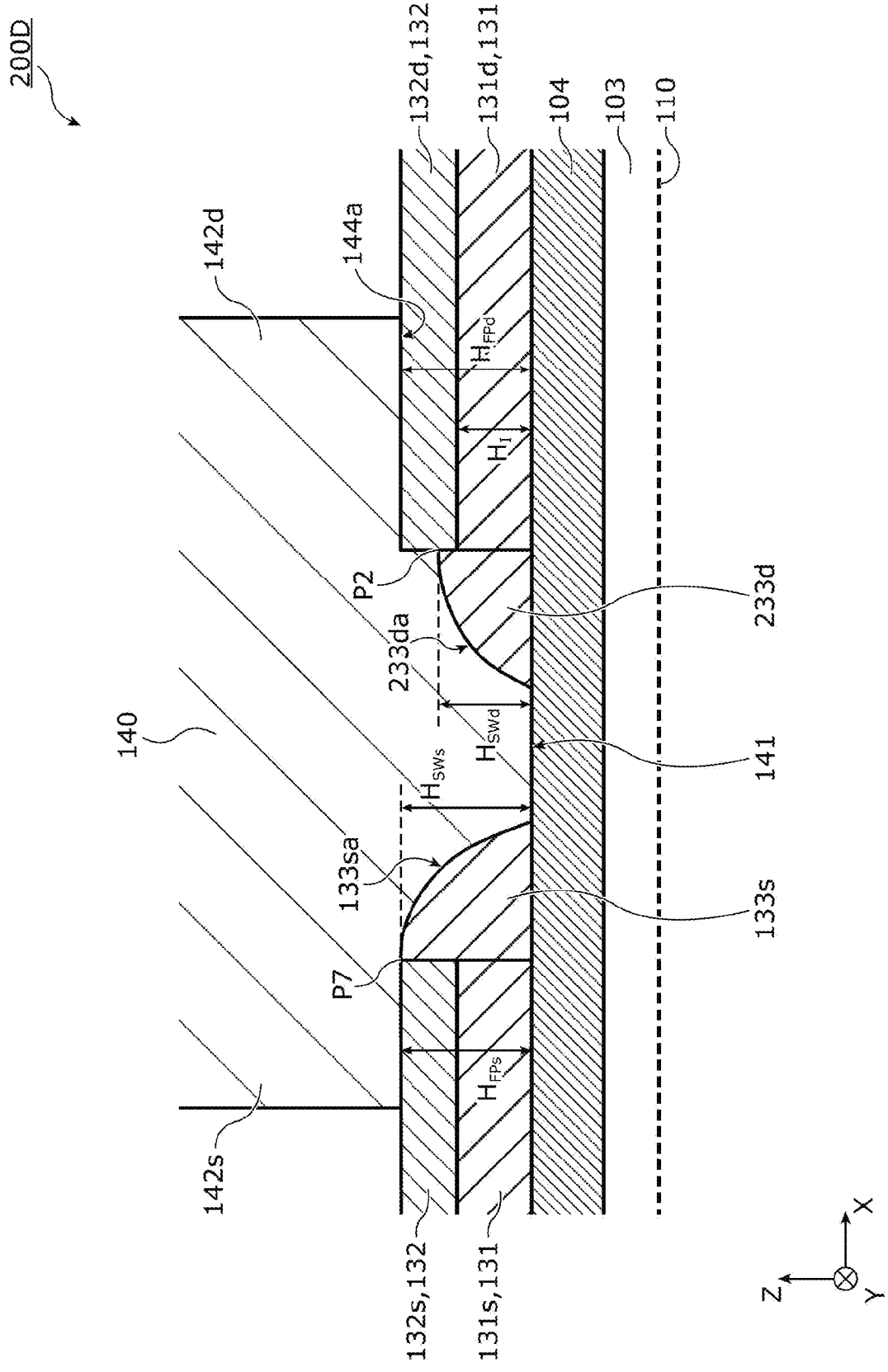
FIG. 17 is an enlarged cross-sectional view illustrating a shape of sidewalls of a semiconductor device according to Variation 4 of Embodiment 2.

FIG. 17 is an enlarged cross-sectional view for explaining the shapes of sidewalls of semiconductor device 200D according to Variation 4 of Embodiment 2. As illustrated in FIG. 17, in the present variation, first sidewall 233d is higher compared to that of Variation 3. More specifically, height $H_{SWd}$ of first sidewall 233d is lower than height $H_{SWs}$ of second sidewall 133s and higher than thickness $H_I$ of first insulating layer 131d.

With this configuration, it is possible to easily maintain the distance between two-dimensional electron gas 110 and projecting portion 142d of gate electrode 140 long in the direction directly below first sidewall 233d, thereby enabling the reduction in the parasitic capacitance (gate-drain capacitance Cgd).

[Variation 5]

Next, Variation 5 will be described with referenced to FIG. 18.

Figure 18:
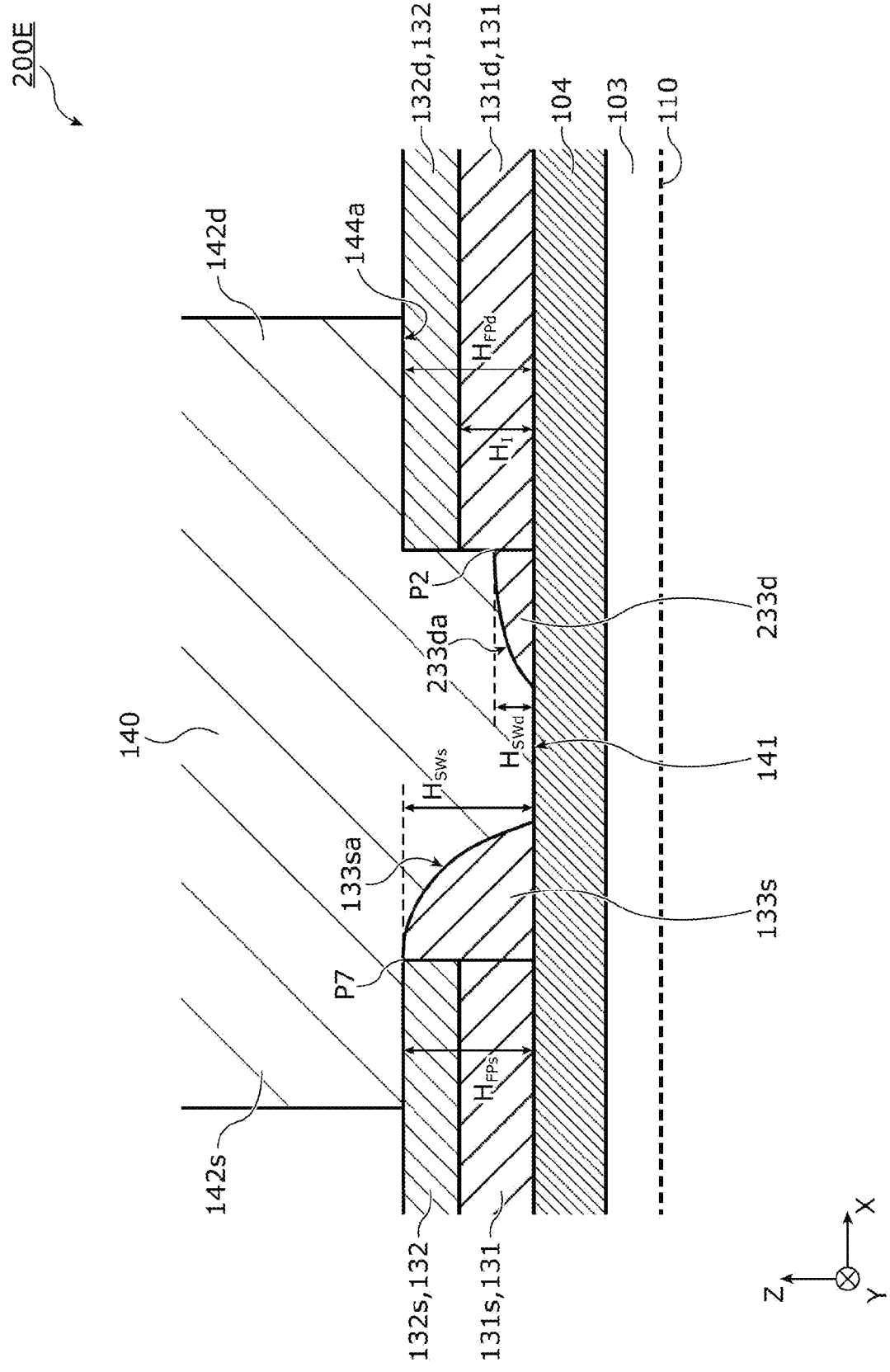
FIG. 18 is an enlarged cross-sectional view illustrating a shape of sidewalls of a semiconductor device according to Variation 5 of Embodiment 2.

FIG. 18 is an enlarged cross-sectional view for explaining the shapes of sidewalls of semiconductor device 200E according to Variation 5 of Embodiment 2. As illustrated in FIG. 18, in the present variation, first sidewall 233d is higher compared to that of Variation 3. More specifically, height $H_{SWd}$ of first sidewall 233d is lower than thickness $H_I$ of first insulating layer 131d and lower than the top surface of first insulating layer 131d (the portion in contact with flat surface 144b of projecting portion 142d). For this reason, a difference in level is generated between the top surface 233da of first sidewall 233d and the top surface of first insulating layer 131d.

With this configuration, since first sidewall 233d is lower, the depletion layer can more easily expand in the direction directly below first sidewall 233d when the transistor is off, and thus it is possible to inhibit the short channel effect. As a result, it is possible to improve the off characteristic.

Other Embodiments

Although the semiconductor device according to one or more aspects has been described above based on the embodiments, the present disclosure is not limited to the above-described embodiments. For example, aside from the above, forms obtained by various modifications to the exemplary embodiment that can be conceived by a person of skill in the art as well as forms realized by arbitrarily combining structural components and functions in the exemplary embodiment which are within the scope of the essence of the present disclosure are included in the present disclosure.

For example, the above-described embodiments and variations have described the examples in which second insulating layer 132 covers source electrode 121 and drain electrode 122, but the present disclosure is not limited to this example. It is sufficient if second insulating layer 132 is located at least in the direction directly below projecting portions 142s and 142d of gate electrode 140. In other words, second insulating layer 132 need not necessarily be provided in the range not overlapping gate electrode 140 in a plan view, for example, between gate electrode 140 and source electrode 121, between gate electrode 140 and drain electrode 122, and in the direction directly above source electrode 121 and drain electrode 122.

In addition, various changes, substitutions, additions, omissions, and so on, can be carried out in the above-described embodiments within the scope of the claims or its equivalents.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is useful for power switching devices, etc., for use in communication devices, inverters, power supply circuits, etc. for which high-speed operation is required.

The invention claimed is:

1. A semiconductor device comprising:
   a substrate;
   a channel layer disposed above the substrate and including a group III nitride semiconductor;
   a barrier layer disposed above the channel layer and including a group III nitride semiconductor with a bandgap larger than a bandgap of the channel layer;
   a source electrode and a drain electrode disposed above the barrier layer and spaced apart from each other in a first direction in a plan view of the substrate;
   a gate electrode disposed between the source electrode and the drain electrode and spaced apart from each of the source electrode and the drain electrode in the first direction; and
   an insulating layer disposed above the barrier layer and disposed between the gate electrode and the source electrode and between the gate electrode and the drain electrode, wherein the insulating layer includes a first insulating layer as a bottom layer and a second insulating layer located above the first insulating layer, the first insulating layer including silicon nitride, the second insulating layer including silicon oxide, the gate electrode includes:
- a junction portion that forms a Schottky junction with the barrier layer; and
- a first projecting portion and a second projecting portion in the first direction, the first projecting portion projecting toward the drain electrode from the junction portion, the second projecting portion projecting toward the source electrode from the junction portion, the insulating layer includes:
- a first sidewall between the first projecting portion and the barrier layer in a second direction perpendicular to a main surface of the substrate, the first sidewall being located at one end on a junction portion side of the insulating layer between the junction portion and the drain electrode; and
- a second sidewall between the second projecting portion and the barrier layer in the second direction, the second sidewall being located at an other end on the junction portion side of the insulating layer between the junction portion and the source electrode, the first projecting portion includes:
- a first electric field plate extending in a section from a first position to a second position in the plan view, the first position being at an end on the junction portion side of the first sidewall, the second position being at an end of the first sidewall on the drain electrode side; and
- a second electric field plate extending in a section from the second position to a third position in the plan view, the third position being at an end on the drain electrode side of the first projecting portion, the first insulating layer and the second insulating layer are stacked between the second electric field plate and the barrier layer, in a cross-section parallel to each of the first direction and the second direction and passing though the junction portion:
- a tangent line at the first position of a top surface of the first sidewall is inclined at a first elevation angle relative to the main surface;
- an angle formed between a highest position of a bottom surface of the first electric field plate and the main surface from a viewpoint of the first position is a second elevation angle; and
- an angle formed between an end on the drain electrode side of a lowest portion of a bottom surface of the second electric field plate on the drain electrode side and the main surface from the viewpoint of the first position is a third elevation angle, the second elevation angle is larger than the third elevation angle, the bottom surface of the second electric field plate includes an inclined surface where a distance from the barrier layer monotonically increases in a direction from the gate electrode to the drain electrode, in the cross-section, a fifth elevation angle is smaller than the second elevation angle, the fifth elevation angle being an angle formed between an end on the drain electrode side of a highest portion of the bottom surface of the second electric field plate and the main surface from the viewpoint of the end of the lowest portion of the bottom surface of the second electric field plate on the drain electrode side, and the second insulating layer overlaps a lowest position of the bottom surface of the second electric field plate in the plan view.

2. The semiconductor device according to claim 1, wherein
a portion of the second projecting portion located between the source electrode and the second sidewall is not located below a highest position of the top surface of the first sidewall.

3. The semiconductor device according to claim 1, further comprising:
a source electric field plate disposed above the gate electrode and set at an electric potential identical to an electric potential of the source electrode, wherein
in the cross-section, the source electric field plate does not protrude below a virtual line connecting the first position and the end on the drain electrode side of the highest portion of the bottom surface of the second electric field plate.

4. The semiconductor device according to claim 3, wherein
in the cross-section, a surface of the source electric field plate is in contact with the virtual line.

5. The semiconductor device according to claim 1, wherein
the inclined surface includes at least one inclined surface with an angle of inclination relative to the main surface within a range of 45 degrees±5 degrees, inclusive.

6. The semiconductor device according to claim 1, wherein
in the cross-section, the third elevation angle is larger than a fourth elevation angle, the fourth elevation angle being an angle formed between the end on the drain electrode side of the highest portion of the bottom surface of the second electric field plate and the main surface from the viewpoint of the first position.

7. The semiconductor device according to claim 1, wherein
in the cross-section, a fourth elevation angle is larger than the third elevation angle, the fourth elevation angle being an angle formed between the end on the drain electrode side of the highest portion of the bottom surface of the second electric field plate and the main surface from the viewpoint of the first position.

8. The semiconductor device according to claim 1, wherein
the bottom surface of the second electric field plate is in contact with the first insulating layer.

9. The semiconductor device according to claim 1, wherein
in the cross-section, the third elevation angle is identical to a fourth elevation angle, the fourth elevation angle being an angle formed between the end on the drain electrode side of the highest portion of the bottom surface of the second electric field plate and the main surface from the viewpoint of the first position.

10. A semiconductor device comprising:
a substrate;
a channel layer disposed above the substrate and including a group III nitride semiconductor;
a barrier layer disposed above the channel layer and including a group III nitride semiconductor with a bandgap larger than a bandgap of the channel layer;

a source electrode and a drain electrode disposed above the barrier layer and spaced apart from each other in a first direction in a plan view of the substrate;

a gate electrode disposed between the source electrode and the drain electrode and spaced apart from each of the source electrode and the drain electrode in the first direction; and an insulating layer disposed above the barrier layer and disposed between the gate electrode and the source electrode and between the gate electrode and the drain electrode, wherein the insulating layer includes a first insulating layer as a bottom layer and a second insulating layer located above the first insulating layer, the first insulating layer including silicon nitride, the second insulating layer including silicon oxide, the gate electrode includes:
 a junction portion that forms a Schottky junction with the barrier layer; and
 a first projecting portion and a second projecting portion in the first direction, the first projecting portion projecting toward the drain electrode from the junction portion, the second projecting portion projecting toward the source electrode from the junction portion, the insulating layer includes:
 a first sidewall between the first projecting portion and the barrier layer in a second direction perpendicular to a main surface of the substrate, the first sidewall being located at one end on a junction portion side of the insulating layer between the junction portion and the drain electrode; and
 a second sidewall between the second projecting portion and the barrier layer in the second direction, the second sidewall being located at an other end on the junction portion side of the insulating layer between the junction portion and the source electrode, the first projecting portion includes:
 a first electric field plate extending in a section from a first position to a second position in the plan view, the first position being at an end on the drain electrode side of the first sidewall on the junction portion side, the second position being at an end of the first sidewall; and
 a second electric field plate extending in a section from the second position to a third position in the plan view, the third position being at an end on the drain electrode side of the first projecting portion, the first insulating layer and the second insulating layer are stacked between the second electric field plate and the barrier layer, in a cross-section parallel to each of the first direction and the second direction and passing though the junction portion:
 a tangent line at the first position of a top surface of the first sidewall is inclined at a first elevation angle relative to the main surface;
 an angle formed between a highest position of a bottom surface of the first electric field plate and the main surface from a viewpoint of the first position is a second elevation angle; and
 an angle formed between an end on the drain electrode side of a lowest portion of a bottom surface of the second electric field plate and the main surface from the viewpoint of the first position is a third elevation angle, and a highest position of the top surface of the first sidewall is located below a highest position of a top surface of the second sidewall.

11. The semiconductor device according to claim 10, wherein
 the bottom surface of the second electric field plate includes an inclined surface where a distance from the barrier layer monotonically increases in a direction from the gate electrode to the drain electrode.

12. The semiconductor device according to claim 11, wherein
 in the cross-section, a fifth elevation angle is smaller than the second elevation angle, the fifth elevation angle being an angle formed between an end of a highest portion of the bottom surface of the second electric field plate on the drain electrode side and the main surface from the viewpoint of the end on the drain electrode side of the lowest portion of the bottom surface of the second electric field plate.

13. The semiconductor device according to claim 12, wherein
 in the cross-section, the third elevation angle is larger than a fourth elevation angle, the fourth elevation angle being an angle formed between the end on the drain electrode side of the highest portion of the bottom surface of the second electric field plate and the main surface from the viewpoint of the first position.

14. The semiconductor device according to claim 12, wherein
 the second insulating layer overlaps a lowest position of the bottom surface of the second electric field plate in the plan view.

15. The semiconductor device according to claim 12, wherein
 in the cross-section, a fourth elevation angle is larger than the third elevation angle, the fourth elevation angle being an angle formed between the end on the drain electrode side of the highest portion of the bottom surface of the second electric field plate and the main surface from the viewpoint of the first position.

16. The semiconductor device according to claim 12, wherein
 the bottom surface of the second electric field plate is in contact with the first insulating layer.

17. The semiconductor device according to claim 10, wherein
 a portion of the second projecting portion located between the source electrode and the second sidewall is not located below the highest position of the top surface of the first sidewall.

18. A semiconductor device comprising:
 a substrate;
 a channel layer disposed above the substrate and including a group III nitride semiconductor;
 a barrier layer disposed above the channel layer and including a group III nitride semiconductor with a bandgap larger than a bandgap of the channel layer;
 a source electrode and a drain electrode disposed above the barrier layer and spaced apart from each other in a first direction in a plan view of the substrate;
 a gate electrode disposed between the source electrode and the drain electrode and spaced apart from each of the source electrode and the drain electrode in the first direction;

an insulating layer disposed above the barrier layer and
disposed between the gate electrode and the source
electrode and between the gate electrode and the drain
electrode; and
a source electric field plate disposed above the gate
electrode and set at an electric potential identical to an
electric potential of the source electrode, wherein
the insulating layer includes a first insulating layer as a
bottom layer and a second insulating layer located
above the first insulating layer, the first insulating layer
including silicon nitride, the second insulating layer
including silicon oxide,
the gate electrode includes:
   a junction portion that forms a Schottky junction with
      the barrier layer; and
   a first projecting portion and a second projecting por-
      tion in the first direction, the first projecting portion
      projecting toward the drain electrode from the junc-
      tion portion, the second projecting portion projecting
      toward the source electrode from the junction por-
      tion,
the insulating layer includes:
a first sidewall between the first projecting portion and the
   barrier layer in a second direction perpendicular to a
   main surface of the substrate, the first sidewall being
   located at one end on a junction portion side of the
   insulating layer between the junction portion and the
   drain electrode; and
   a second sidewall between the second projecting por-
      tion and the barrier layer in the second direction, the
      second sidewall being located at an other end on the
      junction portion side of the insulating layer between
      the junction portion and the source electrode,
the first projecting portion includes:
   a first electric field plate extending in a section from a
      first position to a second position in the plan view,
      the first position being at an end of the first sidewall
      on the junction portion side, the second position
      being at an end on the drain electrode side of the first
      sidewall; and
   a second electric field plate extending in a section from
      the second position to a third position in the plan
      view, the third position being at an end on the drain
      electrode side of the first projecting portion,
the first insulating layer and the second insulating layer
   are stacked between the second electric field plate and
   the barrier layer,
in a cross-section parallel to each of the first direction and
   the second direction and passing though the junction
   portion:
   a tangent line at the first position of a top surface of the
      first sidewall is inclined at a first elevation angle
      relative to the main surface;
   an angle formed between a highest position of a bottom
      surface of the first electric field plate and the main
      surface from a viewpoint of the first position is a
      second elevation angle; and
   an angle formed between an end on the drain electrode
      side of a lowest portion of a bottom surface of the
      second electric field plate and the main surface from
      the viewpoint of the first position is a third elevation
      angle,
the second elevation angle is larger than the third eleva-
   tion angle,
the bottom surface of the second electric field plate
   includes an inclined surface where a distance from the
   barrier layer monotonically increases in a direction
   from the gate electrode to the drain electrode,
a portion of the second projecting portion located between
   the source electrode and the second sidewall is not
   located below a highest position of the top surface of
   the first sidewall,
in the cross-section, the source electric field plate does not
   protrude below a virtual line connecting the first posi-
   tion and the end on the drain electrode side of the
   highest portion of the bottom surface of the second
   electric field plate, and
in the cross-section, a surface of the source electric field
   plate is in contact with the virtual line.
19. The semiconductor device according to claim 18,
wherein
   in the cross-section, a fifth elevation angle is smaller than
      the second elevation angle, the fifth elevation angle
      being an angle formed between the end on the drain
      electrode side of the highest portion of the bottom
      surface of the second electric field plate and the main
      surface from the viewpoint of the end on the drain
      electrode side of the lowest portion of the bottom
      surface of the second electric field plate.
20. The semiconductor device according to claim 18,
wherein
   in the cross-section, the third elevation angle is identical
      to a fourth elevation angle, the fourth elevation angle
      being an angle formed between the end on the drain
      electrode side of the highest portion of the bottom
      surface of the second electric field plate and the main
      surface from the viewpoint of the first position.

* * * * *